US008802355B2

(12) United States Patent
Shimono et al.

(10) Patent No.: US 8,802,355 B2
(45) Date of Patent: Aug. 12, 2014

(54) LITHOGRAPHIC PRINTING PLATE PRECURSOR AND PLATE MAKING METHOD THEREOF

(75) Inventors: Katsuhiro Shimono, Shizuoka (JP); Hidekazu Oohashi, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 775 days.

(21) Appl. No.: 12/893,882

(22) Filed: Sep. 29, 2010

(65) Prior Publication Data

US 2011/0076621 A1 Mar. 31, 2011

(30) Foreign Application Priority Data

Sep. 30, 2009 (JP) ................................ P2009-228945

(51) Int. Cl.

| | |
|---|---|
| ***B41M 5/00*** | (2006.01) |
| ***B41N 1/00*** | (2006.01) |
| ***G03F 7/00*** | (2006.01) |
| ***G03F 7/26*** | (2006.01) |
| ***G03C 1/72*** | (2006.01) |

(52) U.S. Cl.

USPC .................. 430/284.1; 430/270.1; 430/271.1; 430/281.1; 430/302; 430/138; 101/453; 101/463.1

(58) Field of Classification Search

USPC ..................... 430/138, 270.1–309; 101/450.1

See application file for complete search history.

(56) References Cited

U.S. PATENT DOCUMENTS

| | | | | |
|---|---|---|---|---|
| 2001/0018159 | A1 | 8/2001 | Maemoto | |
| 2002/0177074 | A1 | 11/2002 | Hoshi et al. | |
| 2003/0064318 | A1 | 4/2003 | Huang et al. | |
| 2006/0257782 | A1* | 11/2006 | Maemoto | 430/270.1 |
| 2008/0199804 | A1* | 8/2008 | Oohashi | 430/270.1 |
| 2010/0248140 | A1* | 9/2010 | Kuramoto | 430/280.1 |

FOREIGN PATENT DOCUMENTS

| | | | |
|---|---|---|---|
| JP | 2001-277740 | A | 10/2001 |
| JP | 2001-277742 | A | 10/2001 |
| JP | 2002-287334 | A | 10/2002 |
| JP | 3708343 | B2 | 10/2005 |
| JP | 2006-76258 | A | 3/2006 |
| JP | 2007/187836 | A | 7/2007 |
| WO | 2007/077207 | A2 | 7/2007 |

* cited by examiner

*Primary Examiner* — Chanceity Robinson

(74) *Attorney, Agent, or Firm* — Birch, Stewart, Kolsach & Birch, LLP

(57) ABSTRACT

A lithographic printing plate precursor includes a support, and an image-recording layer, the image-recording layer contains a urethane resin having a polyalkylene oxide chain represented by the formula (1) as defined herein in a side chain, an infrared absorbing agent, a radical polymerizable compound and a radical polymerization initiator, and an unexposed area of the image-recording layer is capable of being removed with at least one of dampening water and ink.

14 Claims, No Drawings

LITHOGRAPHIC PRINTING PLATE PRECURSOR AND PLATE MAKING METHOD THEREOF

CROSS-REFERENCE TO RELATED APPLICATIONS

This application claims the benefit of Japanese Patent Application JP 2009-228945, filed Sep. 30, 2009, the entire content of which is hereby incorporated by reference, the same as if set forth at length.

FIELD OF THE INVENTION

The present invention relates to a lithographic printing plate precursor and a plate making method using the same. More particularly, it relates to a lithographic printing plate precursor capable of undergoing a direct plate making on a printing machine after image exposure with laser and a plate making method comprising conducting on-press development of the lithographic printing plate precursor.

BACKGROUND OF THE INVENTION

In general, a lithographic printing plate is composed of an oleophilic image area accepting ink and a hydrophilic non-image area accepting dampening water (fountain solution) in the process of printing. Lithographic printing is a printing method utilizing the nature of water and oily ink to repel with each other and comprising rendering the oleophilic image area of the lithographic printing plate to an ink-receptive area and the hydrophilic non-image area thereof to a dampening water-receptive area (ink-unreceptive area), thereby making a difference in adherence of the ink on the surface of the lithographic printing plate, depositing the ink only to the image area, and then transferring the ink to a printing material, for example, paper.

In order to produce the lithographic printing plate, a lithographic printing plate precursor (PS plate) comprising a hydrophilic support having provided thereon an oleophilic photosensitive resin layer (image-recording layer) is used.

Specifically, the PS plate is exposed through a mask, for example, a lith film, and then subjected to development processing, for example, with an alkaline developer to remove the unnecessary image-recording layer corresponding to the non-image area by dissolving while leaving the image-recording layer corresponding to the image area, thereby obtaining the lithographic printing plate.

Due to the recent progress in the technical field, nowadays the lithographic printing plate can be obtained by a CTP (computer-to-plate) technology. Specifically, a lithographic printing plate precursor is directly subjected to scanning exposure using laser or laser diode without using a lith film and developed to obtain a lithographic printing plate.

With the progress described above, the issue on the lithographic printing plate precursor has transferred to improvements, for example, in image-forming property corresponding to the CTP technology, printing property or physical property. Also, with the increasing concern about global environment, as another issue on the lithographic printing plate precursor, an environmental problem on waste liquid discharged accompanying the wet treatment, for example, development processing comes to the front.

In response to the environmental problem, simplification of development or plate making or non-processing has been pursued. As one method of simple plate making, a method referred to as an "on-press development" is practiced. Specifically, according to the method after exposure of a lithographic printing plate precursor, the lithographic printing plate precursor is mounted as it is on a printing machine without conducting conventional development and removal of the unnecessary area of image-recording layer is performed at an early stage of printing step.

Also, as a method of simple development, a method referred to as a "gum development" is practiced wherein the removal of the unnecessary area of image-recording layer is performed using not a conventional high alkaline developer but a finisher or gum solution of near-neutral pH.

In the simplification of plate making operation as described above, a system using a lithographic printing plate precursor capable of being handled in a bright room or under a yellow lump and a light source is preferable from the standpoint of workability. Thus, as the light source, a semiconductor laser emitting an infrared ray having a wavelength of 760 to 1,200 or a solid laser, for example, YAG laser, is used. An UV laser is also used.

As the lithographic printing plate precursor capable of undergoing on-press development, for instance, a lithographic printing plate precursor having provided on a hydrophilic support, an image-recording layer (heat-sensitive layer) containing microcapsules having a polymerizable compound encapsulated therein is described in JP-A-2001-277740 (the term "JP-A" as used herein means an "unexamined published Japanese patent application") and JP-A-2001-277742. A lithographic printing plate precursor having provided on a support, an image-recording layer (photosensitive layer) containing an infrared absorbing agent, a radical polymerization initiator and a polymerizable compound is described in JP-A-2002-287334. A lithographic printing plate precursor capable of undergoing on-press development having provided on a support, an image-recording layer containing a polymerizable compound and a graft polymer having a polyethylene oxide chain in its side chain or a block polymer having a polyethylene oxide block is described in U.S. Patent Publication No. 2003/0064318.

With respect to a lithographic printing plate precursor capable of undergoing on-press development using a urethane resin as a binder, for example, there is a description in Japanese Patent 3708343. Also, in JP-A-2006-76258 an example of a urethane resin having an ethylene oxide chain at a terminal of its main chain is described.

As an example of binder having an ethylene oxide chain, a lithographic printing plate precursor containing a urethane binder having a polyether unit in its main chain is described in JP-A-2007-187836 and WO 2007/077207.

However, even when various binders described in the prior art are used, it is unable to fulfill not only sufficient printing durability but also problems of sufficient on-press development property, stain resistant and on-press development scum. More specifically, the on-press development property is insufficient and there is a problem of generation of on-press development scum on a printing machine as well.

SUMMARY OF THE INVENTION

An object of the present invention is to provide a lithographic printing plate precursor of on-press development type which exhibits high printing durability, excellent developing property and stain resistance and less on-press development scum and a plate making method thereof.

(1) A lithographic printing plate precursor comprising a support and an image-recording layer which contains a urethane resin having a polyalkylene oxide chain represented by formula (1) shown below in its side chain, an infrared absorbing agent, a radical polymerizable compound and a radical polymerization initiator and an unexposed area of which is capable of being removed with at least any one of dampening water and ink on a printing machine.

$$—[CH_2CH(R_1)O]_n—R_2 \quad \text{Formula (1)}$$

In formula (1), $R_1$ each independently represents a hydrogen atom or a methyl group, $R_2$ represents a hydrogen atom or an alkyl group, alkenyl group or aryl group having 12 or less carbon atoms, and n represents an integer of 2 to 60.

(2) The lithographic printing plate precursor as described in (1) above, wherein the urethane resin is a urethane resin synthesized using at least any one of compounds represented by formulae (2) and (3) shown below.

Formula (2)

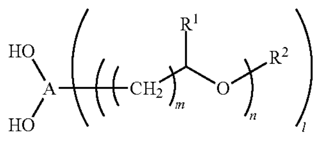

Formula (3)

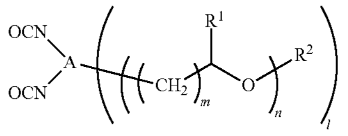

In formulae (2) and (3), m represents from 1 to 3, n represents from 2 to 60, l represents 1 to 6, $R^1$ each independently represents a hydrogen atom or a methyl group, $R^2$ each independently represents a hydrogen atom or an alkyl group, alkenyl group or aryl group having 12 or less carbon atoms, and A represents a 3-valent to 8-valent group.

(3) The lithographic printing plate precursor as described in (2) above, wherein a content of a repeating unit derived from the compound represented by formula (2) or (3) is from 10 to 90% by mole based on a total mole number of a diol and a diisocyanate used in synthesis of the urethane resin.

(4) The lithographic printing plate precursor as described in any one of (1) to (3) above, wherein the urethane resin further has one or more ethylenically unsaturated groups.

(5) The lithographic printing plate precursor as described in any one of (1) to (4) above, wherein the radical polymerizable compound has at least one of a urethane bond and an isocyanuric ring.

(6) The lithographic printing plate precursor as described in any one of (1) to (5) above, wherein the urethane resin has a weight average molecular weight (Mw) of 10,000 to 300,000.

(7) The lithographic printing plate precursor as described in any one of (1) to (6) above, wherein the image-recording layer contains a polymer fine particle.

(8) The lithographic printing plate precursor as described in (7) above, wherein the polymer fine particle is a microcapsule containing a compound having one or more ethylenically unsaturated groups.

(9) The lithographic printing plate precursor as described in (7) above, wherein the polymer fine particle is an organic resin fine particle containing at least acrylonitrile as a constituting component.

(10) The lithographic printing plate precursor as described in any one of (1) to (9) above, which further comprises a protective layer on the image-recording layer.

(11) The lithographic printing plate precursor as described in (10) above, wherein the protective layer contains a hydrophilic resin.

(12) The lithographic printing plate precursor as described in (10) or (11) above, wherein the protective layer contains an inorganic stratiform compound.

(13) A plate making method of a lithographic printing plate precursor comprising after image exposure of the lithographic printing plate precursor as described in any one of (1) to (12) above, without undergoing a development processing step, removing an unexposed area by supplying at least one of printing ink and dampening water on a printing machine to prepare a lithographic printing plate.

According to the invention, by using as a binder, the urethane resin having a polyalkylene oxide chain represented by the formula (1) in its side chain, the on-press development property is remarkably improved due to hydrophilicity and flexibility of the polyalkylene oxide chain. Further, by introducing the polyalkylene oxide chain into the side chain of urethane resin, an unexpected result is obtained in that due to increase in strength resulting from tangle of polymers after exposure the printing durability is increased.

According to the present invention, a lithographic printing plate precursor of on-press development type which exhibits high printing durability, excellent developing property and stain resistance and less on-press development scum and a plate making method thereof can be provided.

DETAILED DESCRIPTION OF THE INVENTION

[Lithographic Printing Plate Precursor]

The lithographic printing plate precursor according to the invention is characterized by containing the urethane resin having a polyalkylene oxide chain having the specific structure in its side chain described below as a binder polymer in the image-recording layer thereof. By using the urethane resin, a lithographic printing plate precursor of on-press development type which exhibits high printing durability, excellent developing property and stain resistance and less on-press development scum can be provided.

The lithographic printing plate precursor according to the invention may have a protective layer on the image-recording layer or an undercoat layer between the support and the image-recording layer, if desired.

Hereinafter, the constituting elements and components of the lithographic printing plate precursor according to the invention will be described.

[Image-Recording Layer]

(A) Binder Polymer

The urethane resin according to the invention is characterized by having a polyalkylene oxide chain represented by formula (1) shown below in its side chain.

$$—[CH_2CH(R_1)O]_n—R_2 \quad \text{Formula (1)}$$

In formula (1), $R_1$ each independently represents a hydrogen atom or a methyl group, $R_2$ represents a hydrogen atom or an alkyl group, alkenyl group or aryl group having 12 or less carbon atoms, and n represents an integer of 2 to 60.

The urethane resin is preferably a linear polyurethane soluble in N-methylpyrrolidinone or methyl ethyl ketone.

The urethane resin preferably has a carboxylic acid group content of 0.2 meq or less, and particularly preferably has no carboxylic acid group at all. When the urethane resin having a carboxylic acid group is used, the on-press development property may deteriorate.

The urethane resin according to the invention preferably has a weight average molecular weight (Mw) of 10,000 to 300,000. The weight average molecular weight in the invention is a value determined by gel permeation chromatography using THF as a developing solvent and calculated in terms of standard polystyrene.

The urethane resin according to the invention preferably has at least one polyalkylene oxide group represented by formula (5) shown below in its side chain.

Formula (5):

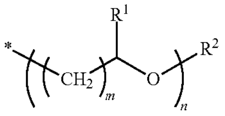

In formula (5), m represents from 1 to 3, preferably 1 or 2, and more preferably 1. n represents preferably from 2 to 60, more preferably from 3 to 60, and particularly preferably from 4 to 50. $R^1$ each independently represents a hydrogen atom or a methyl group. $R^2$ represents a hydrogen atom or an alkyl group, alkenyl group or aryl group having 12 or less carbon atoms, and particularly preferably a hydrogen atom or an alkyl group having 3 or less carbon atoms. The polyalkylene oxide group is connected at the site indicated by * to the main chain of the urethane resin directly or through an appropriate connecting group.

A method of obtaining the urethane resin according to the invention includes (1) a method of reacting diisocyanate having a polyalkylene oxide group and/or diol having a polyalkylene oxide group arbitrarily with other diisocyanate and/or diol, and (2) a method of reacting a compound having a polyalkylene oxide group with a urethane resin.

Method (1) is described below.

[Diol Compound Having a Polyalkylene Oxide Group]

As the diol compound having a polyalkylene oxide group for use in the synthesis of the urethane resin according to the invention, any diol compound having at least one polyalkylene oxide group in its side chain can be suitably used.

Of the diol compounds, a compound represented by formula (2) shown below having the polyalkylene oxide group represented by formula (5) described above is preferred.

Formula (2):

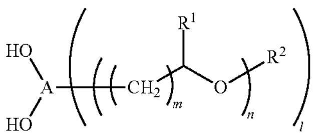

In formula (2), l represents from 1 to 6, preferably from 1 or 4, and more preferably from 1 to 3. m, n, $R^1$ and $R^2$ have the same meanings as m, n, $R^1$ and $R^2$ defined in formula (5) above, respectively, and when two or more $R^2$ are present, $R^2$ may be the same of different.

A represents a 3-valent to 8-valent organic residue constituting from a non-metallic atom and includes an organic residue constituting from at least one atom selected from 1 to 30 carbon atoms, 0 to 10 nitrogen atoms, 0 to 10 oxygen atoms, 0 to 10 halogen atoms, 0 to 10 silicon atoms, 1 to 100 hydrogen atoms, 0 to 10 phosphorus atoms and 0 to 10 sulfur atoms. Preferably, the structures shown below and combinations thereof are exemplified.

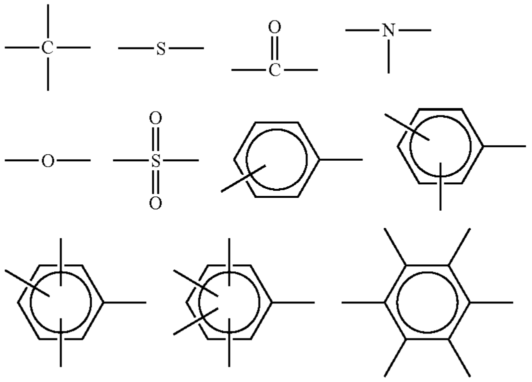

polyvalent naphthalene polyvalent anthracene

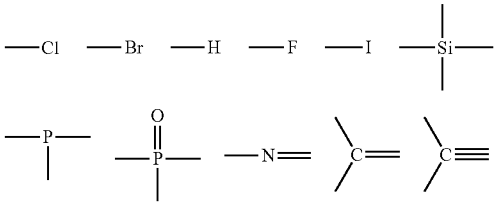

Specific examples of the diol compound having a polyalkylene oxide group in its side chain are set forth below, but the invention should not be construed as being limited thereto.

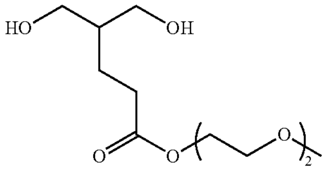

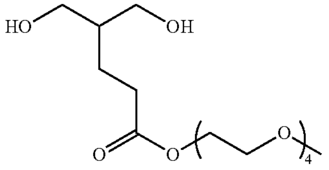

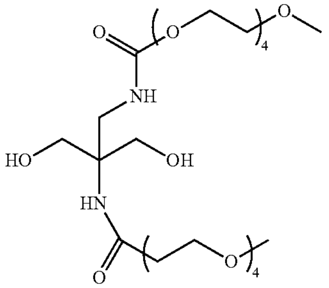

-continued
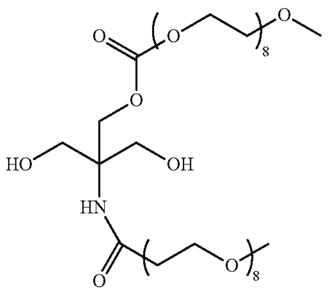
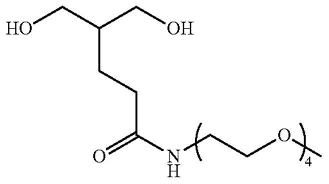
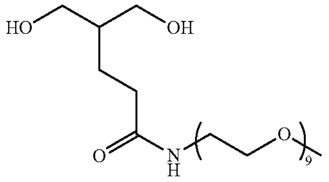
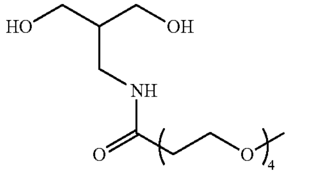
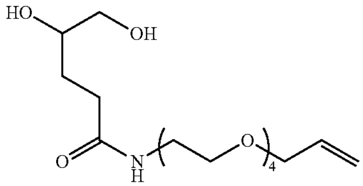
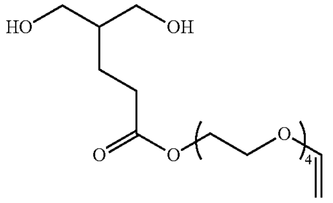
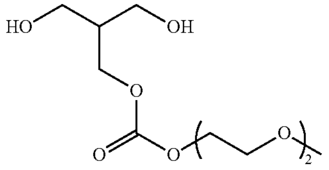
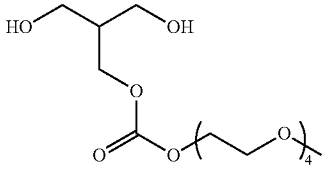
-continued
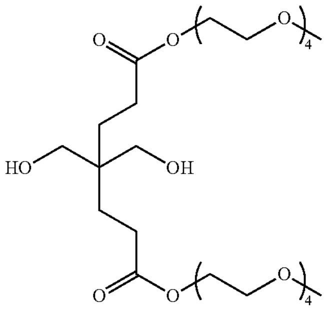
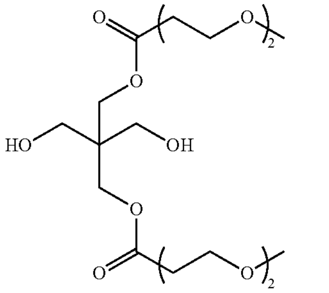
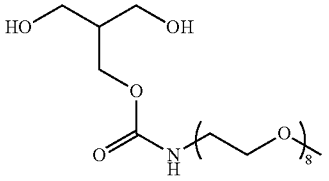
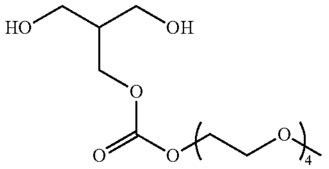
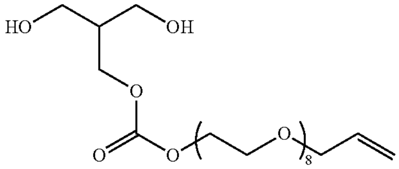
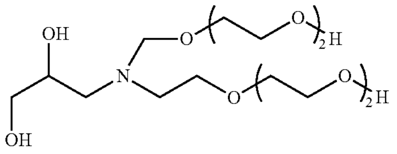
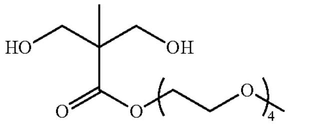
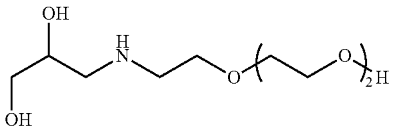
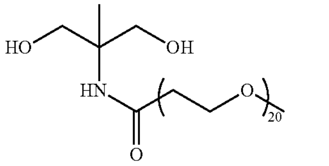

-continued
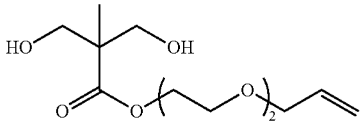
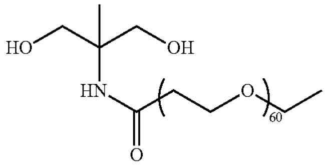
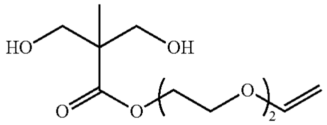
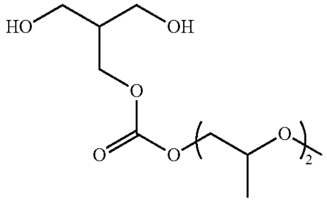
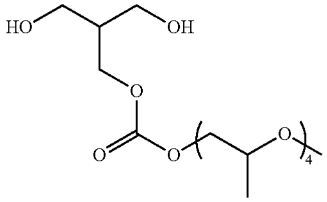
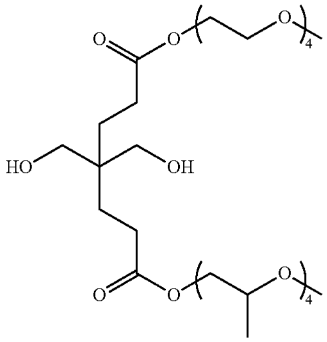
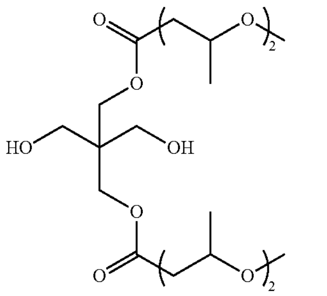
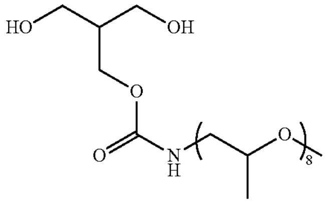
-continued
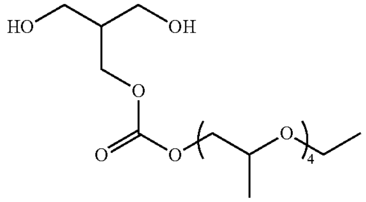
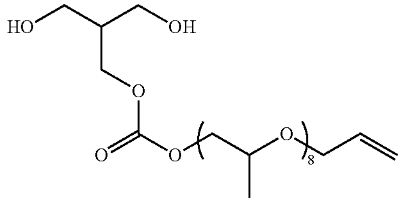
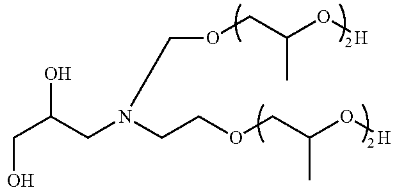
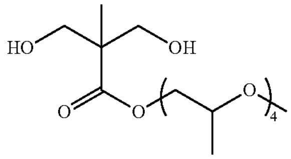
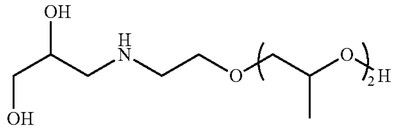
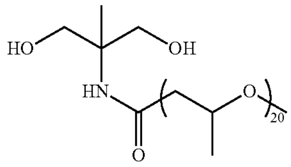
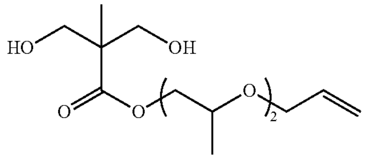
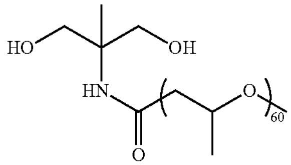
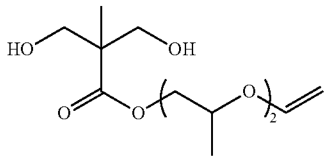
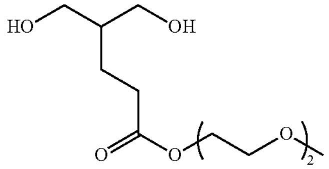

-continued

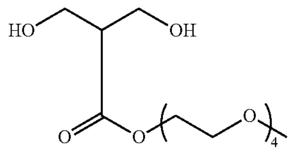

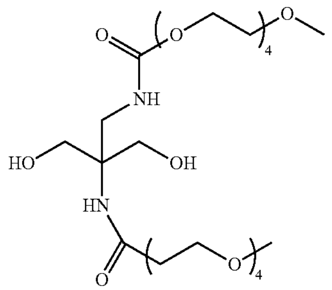

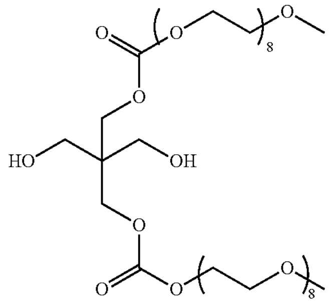

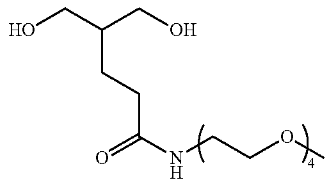

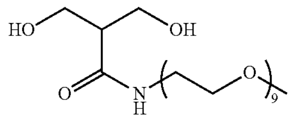

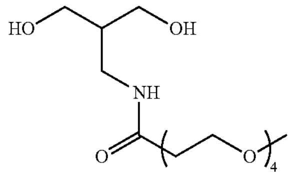

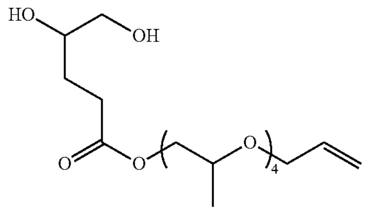

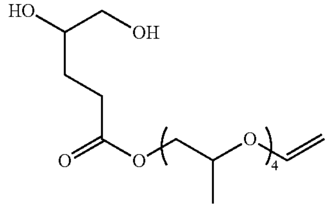

The content of a repeating unit derived from the compound represented by formula (2) in the urethane resin according to the invention is preferably from 5 to 50% by mole, more preferably from 10 to 50% by mole, and still more preferably from 15 to 45% by mole.

[Diisocyanate Compound Having a Polyalkylene Oxide Group]

As the diisocyanate compound having a polyalkylene oxide group for use in the synthesis of the urethane resin according to the invention, any diisocyanate compound having at least one polyalkylene oxide group in its side chain can be suitably used.

Of the diisocyanate compounds, a compound represented by formula (3) shown below having the polyalkylene oxide group represented by formula (5) described above is preferred.

Formula (3):

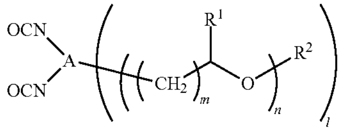

In formula (3), l, m, n, $R^1$ and A have the same meanings as l, m, n, $R^1$ and A defined in formula (2) above, respectively. $R^2$ each independently represents a hydrogen atom or an alkyl group, alkenyl group or aryl group having 12 or less carbon atoms.

The content of the diisocyanate compound represented by formula (3) in the urethane resin according to the invention is preferably from 5 to 50% by mole, more preferably from 10 to 50% by mole, and still more preferably from 15 to 45% by mole.

A method of obtaining the diisocyanate compound represented by formula (3) is not particularly restricted and includes, for example, (1) a method of reacting a compound having 3 or more isocyanate groups (hereinafter, also referred to as a polyvalent isocyanate compound) with a monovalent alcohol or amine having an alkylene oxide group such that two isocyanate groups of the polyvalent isocyanate compound still maintain, and (2) a method of reacting polyisocyanate with a terminal of a diol substituted with a polyalkylene oxide group.

Specific examples of the diisocyanate compound are set forth below, but the invention should not be construed as being limited thereto.

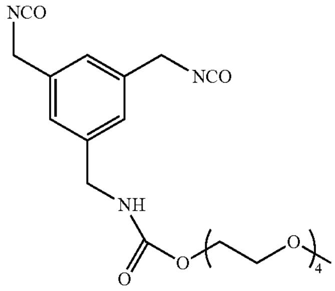

-continued

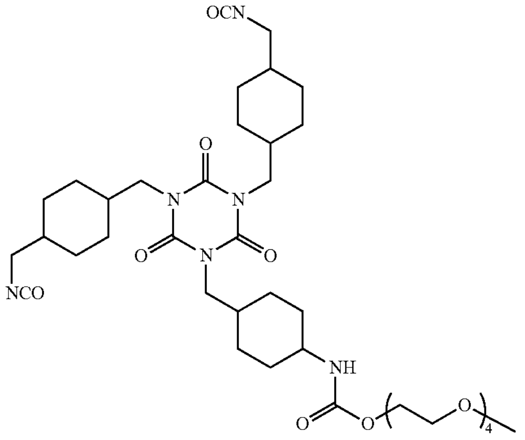

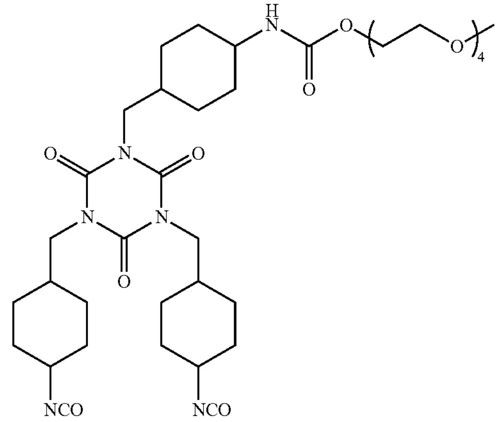

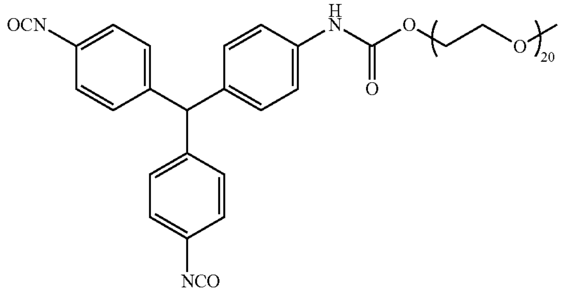

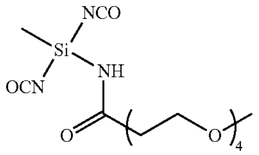

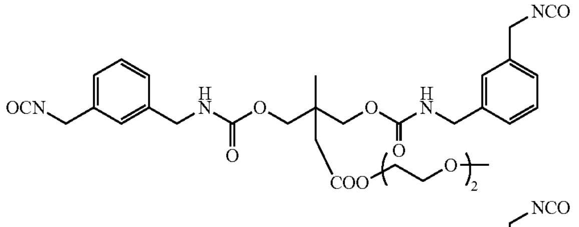

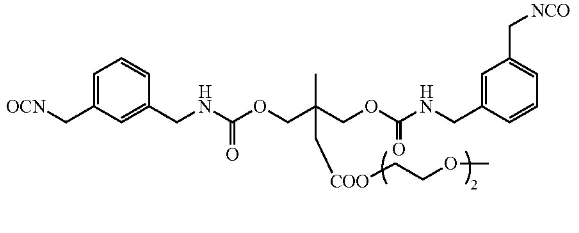

The content of repeating units derived from the diol compound represented by formula (2) and the diisocyanate compound represented by formula (3) in the urethane resin according to the invention is preferably from 10 to 90% by mole based on the total mole number of the diol compound and diisocyanate compound used in the synthesis of the urethane resin.

[Other Diisocyanate Compound]

The diisocyanate compound for use in the synthesis of the urethane resin according to the invention may include a diisocyanate compound which does not have a polyalkylene oxide group. Such a diisocyanate compound is preferably a diisocyanate compound represented by formula (6) shown below.

$$L_1\text{-}(NCO)_n \qquad (6)$$

In formula (6), n represents 2, and $L_1$ represents an n-valent organic residue formed by combination of the structures described for A in formula (2).

The diisocyanate compound represented by formula (6) includes diisocyanate compounds set forth below. Specifically, an aromatic diisocyanate compound, for example, 2,4-tolylene diisocyanate, dimer of 2,4-tolylene diisocyanate, 2,6-tolylene diisocyanate, p-xylylene diisocyanate, m-xylylene diisocyanate, 4,4'-diphenylmethane diisocyanate, 1,5-naphthylene diisocyanate, 1,3-bis(isocyanatemethyl)cyclohexane or 3,3'-dimethylbiphenyl-4,4'-diisocyanate, an aliphatic diisocyanate compound, for example, dicyclohexylmethane-4,4'-diisocyanate, hexamethylene diisocyanate, trimethylhexamethylene diisocyanate, lysine diisocyanate or dimeric acid diisocyanate, an alicyclic diisocyanate compound, for example, isophorone diisocyanate, 4,4'-methylenebis (cyclohexyl isocyanate), methylcyclohexane-2, 4 (or 2,6)-diisocyanate, 1,3-(isocyanatomethyl)cyclohexane, dicyclohexylmethane-4,4'-diisocyanate, and a diisocyanate compound which is a reaction product of a diol with a diisocyanate, for example, an adduct of 1 mole of 1,3-butylene glycol and 2 moles of tolylene diisocyanate are exemplified.

[Other Diol Compound]

As the diol compound for use in the synthesis of the urethane resin according to the invention, a diol compound which does not have a polyalkylene oxide group in its side chain may be used. Preferable examples of such a diol compound include a polyether diol compound, a polyester diol compound and a polycarbonate diol compound.

Examples of the polyether diol compound preferably include the compounds shown below.

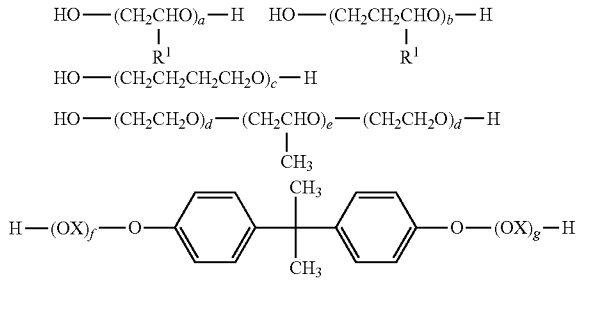

In the formulae, $R^1$ represents a hydrogen atom or a methyl group. X represents a group shown below.

$-CH_2CH_2-$ 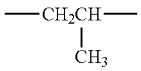

a, b, c, d, e, f and g each represents an integer of 2 or more, and preferably an integer of 2 to 100.

Specific examples of the polyether diol compound include the following compounds. Specifically, diethylene glycol, triethylene glycol, tetraethylene glycol, pentaethylene glycol, hexaethylene glycol, heptaethylene glycol, octaethylene glycol, di-1,2-propylene glycol, tri-1,2-propylene glycol, tetra-1,2-propylene glycol, hexa-1,2-propylene glycol, di-1,3-propylene glycol, tri-1,3-propylene glycol, tetra-1,3-propylene glycol, di-1,3-butylene glycol, tri-1,3-butylene glycol, hexa-1,3-butylene glycol, polyethylene glycol and polypropylene glycol are exemplified.

Examples of the polyester diol compound include compounds represented by formulae (10) and (11) shown below.

(10)

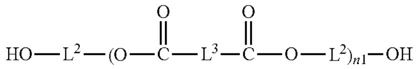

(11)

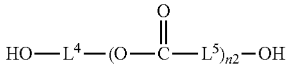

In formulae (10) and (11), $L^3$, which may be the same or different, each represents a single bond or a divalent organic residue formed by combination of the structures described for A in formula (2), and particularly preferably a divalent aliphatic or aromatic hydrocarbon group. $L^2$, $L^4$ and $L^5$ each represents a divalent organic residue formed by combination of the structures described for A in formula (2). $L^2$, $L^3$, $L^4$ and $L^5$ each preferably represents an alkylene group, an alkenylene group, an alkynylene group or an arylene group. n1 and n2 each represents an integer of 1 or more, and preferably an integer of 2 to 100.

Specific examples of the polyester diol compound represented by formula (10) or (11) include the compounds set forth below.

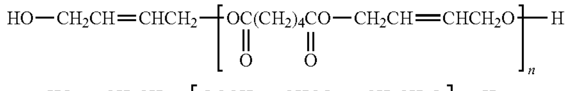

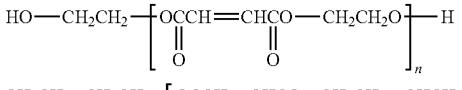

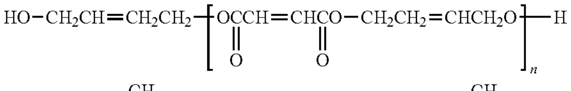

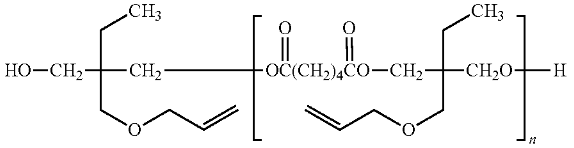

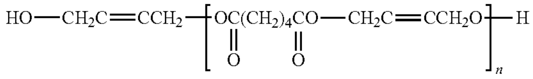

-continued

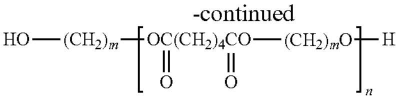

m = 2, 4

1 ≤ n ≤ 1000

$HO-CH_2CH_2-COO-CH_2CH_2-OH$

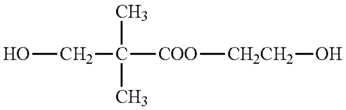

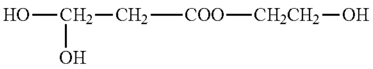

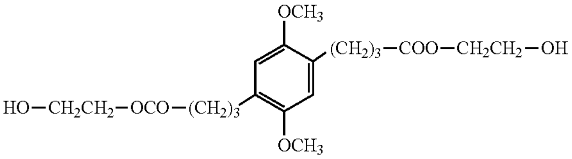

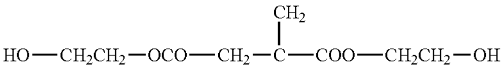

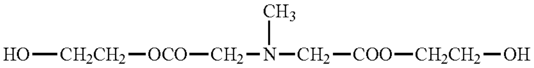

$HO-CH_2CH_2-OCO-CH_2CH_2-COO-CH_2CH_2-OH$

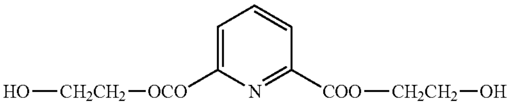

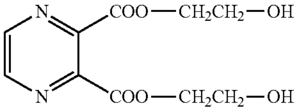

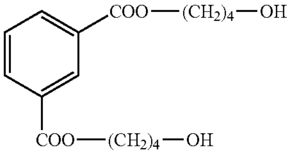

Examples of the polycarbonate diol compound include compounds represented by formula (12) shown below.

(12)

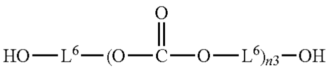

In formula (12), $L^6$, which may be the same or different, each represents a divalent organic residue formed by combination of the structures described for A in formula (2) above, and particularly preferably a divalent aliphatic or aromatic hydrocarbon group. n3 represents an integer of 2 or more, and preferably an integer of 2 to 100.

Specific examples of the polycarbonate diol compound represented by formula (12) include the compounds set forth below.

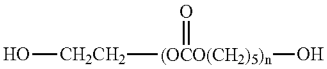

-continued

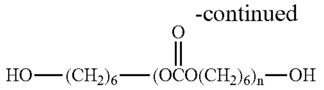

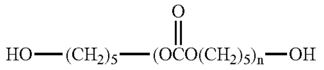

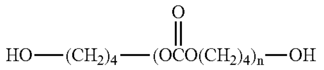

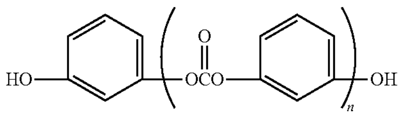

n represents an integer of 1 to 1000.

Further, diol compounds represented by formulae (13) and (14) shown below are also preferably used.

$$HO\text{-}L^{15}\text{-}NH\text{—}CO\text{-}L^{16}\text{-}CO\text{—}NH\text{-}L^{15}\text{-}OH \quad (13)$$

$$HO\text{-}L^{16}\text{-}CO\text{—}NH\text{-}L^{15}\text{-}OH \quad (14)$$

In formulae (13) and (24), $L^{15}$ and $L^{16}$, which may be the same or different, each represents a divalent organic residue formed by combination of the structures described for A in formula (2) above, and particularly preferably a divalent aliphatic or aromatic hydrocarbon group or a heterocyclic group.

Specific examples of the diol compound represented by formulae (13) or (24) include the compounds set forth below.

Moreover, diol compounds represented by formulae (15) to (18) shown below are also preferably used.

$$HO(CH_2)_cOH \quad \text{Formula (15)}$$

Formula (16):

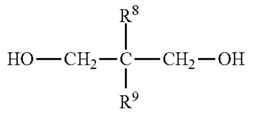

$$HO\text{—}Ar^2\text{-}(L^{17}\text{-}Ar^3)_n\text{—}OH \quad \text{Formula (17)}$$

$$HO\text{—}Ar^2\text{-}L^{17}\text{-}OH \quad \text{Formula (18)}$$

In formulae (15) to (18), $R^8$ and $R^9$, which may be the same or different, each represents an alkyl group which may have a substituent. c represents an integer of 2 or more, and preferably an integer of 2 to 100. $L^{17}$ represents a divalent organic residue formed by combination of the structures described for A in formula (2) above, and particularly preferably a divalent aliphatic or aromatic hydrocarbon group. $Ar^2$ and $Ar^3$ each independently represents an arylene group. n represents an integer of 0 to 10.

Specific examples of the diol compound represented by formula (15) or (16) include the compounds set forth below. Specifically, the diol compound represented by formula (15) includes, for example, ethylene glycol, 1,3-propanediol, 1,4-butanediol, 1,5-pentanediol, 1,6-hexanediol, 1,7-heptanediol and 1,8-octanediol. The diol compound represented by formula (16) includes, for example, the compounds set forth below.

$HO—CH_2CH_2—NHCO—(CH_2)_3—CONH—CH_2CH_2—OH$ 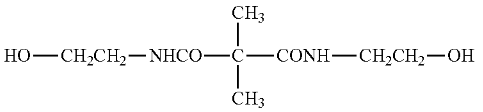

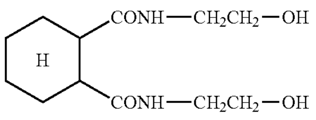 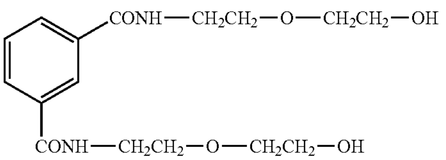

$HO—CH_2CH_2—O—CH_2CH_2—NHCO(CH_2)_4CONH—CH_2CH_2—O—CH_2CH_2—OH$

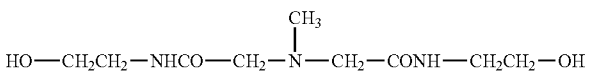

$HO—CH_2CH_2—NHCO—CH_2—S—CH_2—CONH—CH_2CH_2—OH$

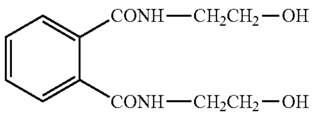 $HO—CH_2CH_2—NHCO—CH{=}CH—CONH—CH_2CH_2—OH$ $HO—CH_2CH_2—NHCO—C{\equiv}C—CONH—CH_2CH_2—OH$

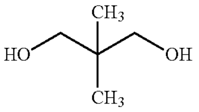

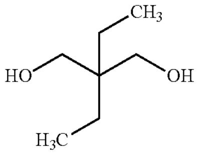

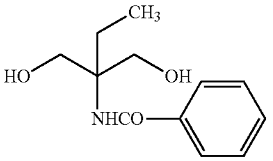

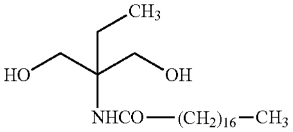

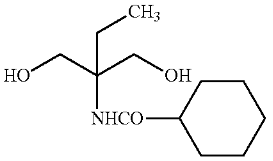

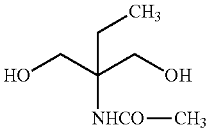

Specific examples of the diol compound represented by formula (17) or (18) include the compounds set forth below. Specifically, catechol, resorcine, hydroquinone, benzonorbornene-3,6-diol, bisphenol A, bisphenol S, 3,3'-dichloro-bisphenol S, 4,4'-dihydroxybenzophenone, 4,4'-dihydroxybiphenyl, 4,4'-thiodiphenol, 2,2'-dihydroxydiphenylmethane, 3,4-bis(p-hydroxyphenyl) hexane, 1,4-bis(2-p-hydroxyphenyl)propyl)benzene, bis(4-hydroxyphenyl)methylamine, 2-hydroxybezyl alcohol, 4-hydroxybezyl alcohol, 2-hydroxy-3,5-di-tert-butylbezyl alcohol, 4-hydroxy-3,5-di-tert-butylbezyl alcohol, 4-hydroxyphenethyl alcohol, 2-hydroxyethyl-4-hydroxybenzoate and 2-hydroxyethyl-4-hydroxyphenylacetate are exemplified.

For the purpose of decreasing a molecular weight in the synthesis of the urethane resin according to the invention, a monofunctional alcohol or amine having from 1 to 15 carbon atoms or a monofunctional isocyanate may be used. The amount of such a compound introduced is preferably from 0 to 20% by mole, more preferably from 0 to 10% by mole, and most preferably from 0 to 5% by mole.

Method (2) is described below.

The urethane resin having a polyalkylene oxide group according to the invention can also be obtained by reacting a compound having a polyalkylene oxide group with a urethane resin as described above. For instance, a reaction between a urethane resin having a carboxyl group in its side chain and a monoglycidyl ether having a polyalkylene oxide group can be utilized.

The urethane resin for use in the invention preferably has an ethylenically unsaturated group. The ethylenically unsaturated group preferably includes an acryloyl group, a methacryloyl group, a vinyl group, a styryl group and an allyl group. The ethylenically unsaturated group can be introduced into the urethane resin by a polymer reaction. For instance, a reaction between a urethane resin having a carboxyl group in its side chain and glycidyl methacrylate or a reaction between a urethane resin having an epoxy group and a carboxylic acid having an ethylenically unsaturated group, for example, methacrylic acid can be utilized.

A unit having an ethylenically unsaturated group preferably has at least one functional group represented by any one of formulae (19) to (21) shown below.

Formula (19):

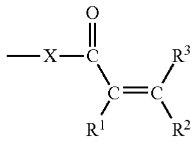

In formula (19), $R^1$ to $R^3$ each independently represents a hydrogen atom or a monovalent organic group. $R^1$ preferably includes, for example, a hydrogen atom or an alkyl group which may have a substituent. Among them, a hydrogen atom or a methyl group is preferred because of high radical reactivity. $R^2$ and $R^3$ each independently preferably includes, for example, a hydrogen atom, a halogen atom, an amino group, a carboxyl group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent and an arylsulfonyl group which may have a substituent. Among them, a hydrogen atom, a carboxyl group, an alkoxycarbonyl group, an alkyl group which may have a substituent or an aryl group which may have a substituent is preferred because of high radical reactivity.

X represents an oxygen atom, a sulfur atom or —N($R^{12}$)—, and $R^{12}$ represents a hydrogen atom or a monovalent organic group. The monovalent organic group represented by $R^{12}$ includes, for example, an alkyl group which may have a substituent. Among them, a hydrogen atom, a methyl group, an ethyl group or an isopropyl group is preferred because of high radical reactivity.

Examples of the substituent which can be introduced include an alkyl group, an alkenyl group, an alkynyl group, an aryl group, an alkoxy group, an aryloxy group, a halogen atom, an amino group, an alkylamino group, an arylamino group, a carboxyl group, an alkoxycarbonyl group, a sulfo group, a nitro group, a cyano group, an amido group, an alkylsulfonyl group and an arylsulfonyl group.

Formula (20):

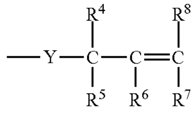

In formula (20), $R^4$ to $R^8$ each independently represents a hydrogen atom or a monovalent organic group. $R^4$ to $R^8$ each independently preferably includes, for example, a hydrogen atom, a halogen atom, an amino group, a dialkylamino group, a carboxyl group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent and an arylsulfonyl group which may have a substituent. Among them, a hydrogen atom, a carboxyl group, an alkoxycarbonyl group, an alkyl group which may have a substituent or an aryl group which may have a substituent is preferred.

Examples of the substituent which can be introduced include those described in formula (19). Y represents an oxygen atom, a sulfur atom or —N($R^{12}$)—, and $R^{12}$ has the same meaning as $R^{12}$ defined in formula (19). Preferable examples for $R^{12}$ are also same as those described in formula (19).

Formula (21):

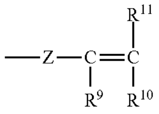

In formula (21), $R^9$ preferably represents, for example, a hydrogen atom or an alkyl group which may have a substituent. Among them, a hydrogen atom or a methyl group is preferred because of high radical reactivity. Examples of the substituent introduced into the group represented by $R^9$ include those described in formula (19).

$R^{10}$ and $R^{11}$ each independently represents, for example, a hydrogen atom, a halogen atom, an amino group, a dialkylamino group, a carboxyl group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent and an arylsulfonyl group which may have a substituent. Among them, a hydrogen atom, a carboxyl group, an alkoxycarbonyl group, an alkyl group which may have a substituent or an aryl group which may have a substituent is preferred because of high radical reactivity. Examples of the substituent introduced in to the group represented by $R^{10}$ or $R^{11}$ include those described in formula (19).

Z represents an oxygen atom, a sulfur atom, —N($R^{13}$)— or a phenylene group which may have a substituent. $R^{13}$ represents, for example, an alkyl group which may have a substituent. Among them, a methyl group, an ethyl group or an isopropyl group is preferred because of high radical reactivity. Examples of the substituent introduced in to the group represented by $R^{13}$ include those described in formula (19).

The content of the ethylenically unsaturated group in the binder polymer is preferably from 0.1 to 40.0 mmol, more preferably from 1.0 to 15.0 mmol, most preferably from 2.0 to 10.0 mmol, per g of the bonder polymer.

Further, into the urethane binder polymer according to the invention an oleophilic group, for example, an alkyl group, an aryl group, an aralkyl group or an alkenyl group may be introduced in order to control the ink-receptive property.

Specific examples (1) to (12) of the binder polymer for use in the invention are set forth in Tables 1 and 2 below, but the invention should not be construed as being limited thereto.

TABLE 1

| Urethane Resin | Diisocyanate Compound Used (% by mole) | Diol Compound Used (% by mole) | Mw |
|---|---|---|---|
| 1 | 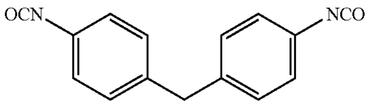<br>25 | 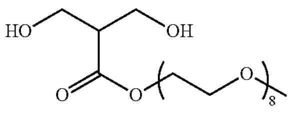<br>25 | 100,000 |
| | 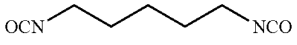<br>25 | 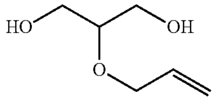<br>25 | |
| 2 | 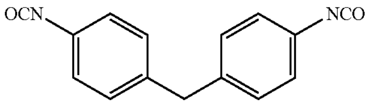<br>25 | 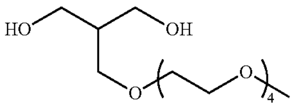<br>25 | 110,000 |
| | 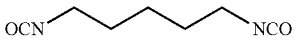<br>25 | 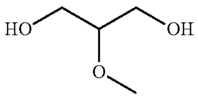<br>25 | |
| 3 | 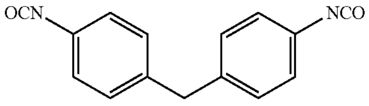<br>25 | 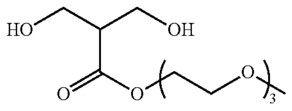<br>25 | 110,000 |
| | 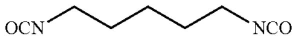<br>25 | 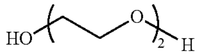<br>25 | |

TABLE 1-continued
| Urethane Resin | Diisocyanate Compound Used (% by mole) | Diol Compound Used (% by mole) | Mw |
|---|---|---|---|
| 4 | 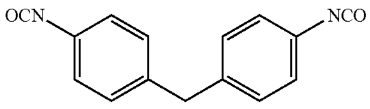<br>25<br>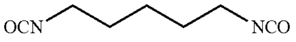<br>25 | 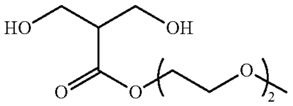<br>25<br>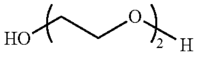<br>25 | 80,000 |
| 5 | 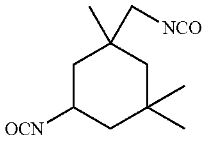<br>40<br>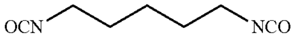<br>10 | 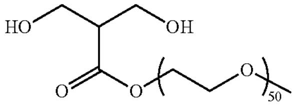<br>25<br>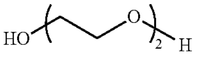<br>25 | 60,000 |
| 6* | 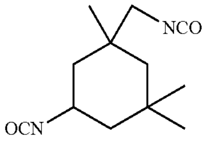<br>40<br>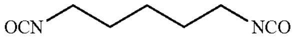<br>10 | 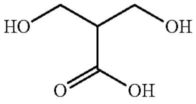<br>10<br>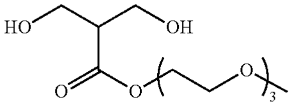<br>40 | 60,000 |
*Acid content: 0.12 meq/g
TABLE 2
| Urethane Resin | Diisocyanate Compound Used (% by mole) | Diol Compound Used (% by mole) | Mw |
|---|---|---|---|
| 7 | 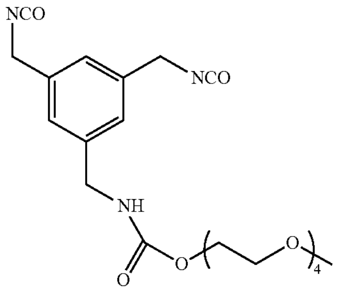<br>25<br>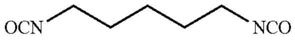<br>25 | 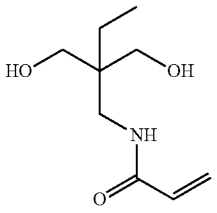<br>25<br>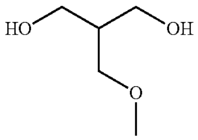<br>25 | 100,000 |

TABLE 2-continued
| Urethane Resin | Diisocyanate Compound Used (% by mole) | Diol Compound Used (% by mole) | Mw |
|---|---|---|---|
| 8 | 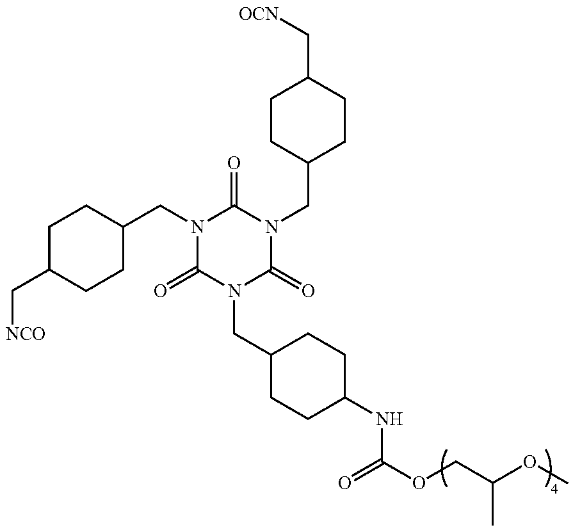<br>25<br>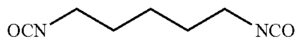<br>25 | 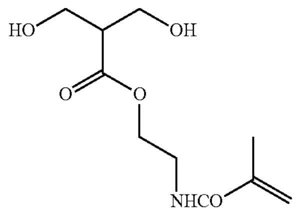<br>25<br>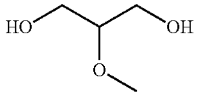<br>25 | 50,000 |
| 9 | 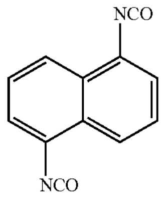<br>45<br>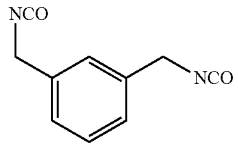<br>5 | 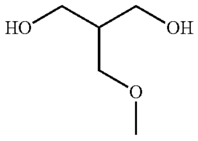<br>45<br>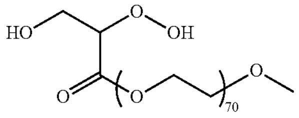<br>5 | 70,000 |
| 10 | 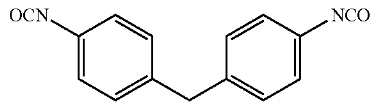<br>25<br>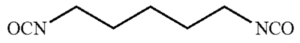<br>25 | 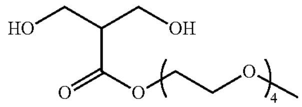<br>35<br>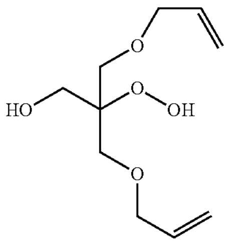<br>10<br>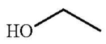<br>5 | 15,000 |

TABLE 2-continued

| Urethane Resin | Diisocyanate Compound Used (% by mole) | Diol Compound Used (% by mole) | Mw |
|---|---|---|---|
| 11 | 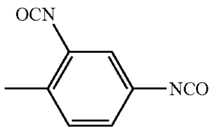<br>40<br>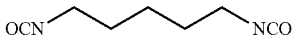<br>10 | 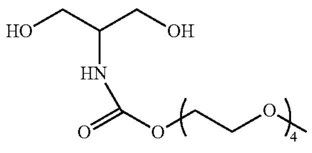<br>25<br>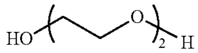<br>20<br>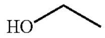<br>5 | 11,000 |
| 12 | 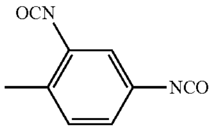<br>40<br>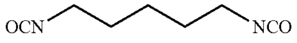<br>10 | 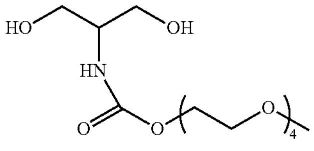<br>25<br>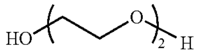<br>20<br>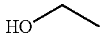<br>5 | 9,000 |

The binder polymer for use in the invention has preferably a weight average molecular weight (Mw) of 10,000 or more, more preferably from 10,000 to 300,000, and still more preferably from 15,000 to 300,000.

The content of the binder polymer is preferably from 5 to 90% by weight, more preferably from 5 to 80% by weight, still more preferably from 10 to 70% by weight, based on the total solid content of the image-recording layer.

(B) Infrared Absorbing Agent

The infrared absorbing agent for use in the invention has a function of converting the infrared ray absorbed to heat and a function of being excited by the infrared ray to perform electron transfer and/or energy transfer to a radical polymerization initiator described hereinafter. The infrared absorbing agent for use in the invention is preferably an infrared absorbing dye having an absorption maximum in a wavelength range of 760 to 1,200 nm.

As the infrared absorbing dye, compounds described in Paragraph Nos. [0058] to [0087] of JP-A-2008-195018 are used.

Of the dyes, cyanine dyes, squarylium dyes, pyrylium dyes and nickel thiolate complexes are particularly preferred. As the particularly preferable example of the dye, a cyanine dye represented by formula (a) shown below is exemplified.

Formula (a):

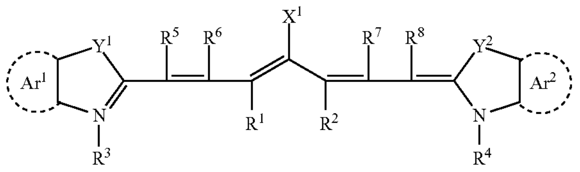

In formula (a), $X^1$ represents a hydrogen atom, a halogen atom, —N($R^9$)($R^{10}$), $X^2$-$L^1$ or a group shown below. $R^9$ and $R^{10}$, which may be the same or different, each represents an aromatic hydrocarbon group having from 6 to 10 carbon atoms, which may have a substituent, an alkyl group having from 1 to 8 carbon atoms, which may have a substituent or a hydrogen atom, or $R^9$ and $R^{10}$ may be combined with each other to form a ring. Among them, a phenyl group is preferable. $X^2$ represents an oxygen atom or a sulfur atom, $L^1$ represents a hydrocarbon group having from 1 to 12 carbon atoms, an aromatic ring group containing a hetero atom or a hydrocarbon group having from 1 to 12 carbon atoms and containing a hetero atom. The hetero atom used herein includes a nitrogen atom, a sulfur atom, an oxygen atom, a halogen atom and a selenium atom. In the group shown below, $Xa^-$ has the same meaning as $Za^-$ defined hereinafter, and $R^a$ represents a hydrogen atom or a substituent selected from an alkyl group, an aryl group, a substituted or unsubstituted amino group and a halogen atom.

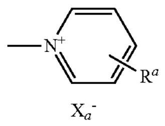

$R^1$ and $R^2$ each independently represents a hydrocarbon group having from 1 to 12 carbon atoms. In view of the preservation stability of a coating solution for image-recording layer, it is preferred that $R^1$ and $R^2$ each represents a hydrocarbon group having two or more carbon atoms. It is also preferred that $R^1$ and $R^2$ are combined with each other to form a 5-membered or 6-membered ring.

$Ar^1$ and $Ar^2$, which may be the same or different, each represents an aromatic hydrocarbon group which may have a substituent. Preferable examples of the aromatic hydrocarbon group include a benzene ring group and a naphthalene ring group. Also, preferable examples of the substituent include a hydrocarbon group having 12 or less carbon atoms, a halogen atom and an alkoxy group having 12 or less carbon atoms. $Y^1$ and $Y^2$, which may be the same or different, each represents a sulfur atom or a dialkylmethylene group having 12 or less carbon atoms. $R^3$ and $R^4$, which may be the same or different, each represents a hydrocarbon group having 20 or less carbon atoms, which may have a substituent. Preferable examples of the substituent include an alkoxy group having 12 or less carbon atoms, a carboxyl group and a sulfo group. $R^5$, $R^6$, $R^7$ and $R^8$, which may be the same or different, each represents a hydrogen atom or a hydrocarbon group having 12 or less carbon atoms. In view of the availability of raw materials, a hydrogen atom is preferred. $Za^-$ represents a counter anion. However, $Za^-$ is not necessary when the cyanine dye represented by formula (a) has an anionic substituent in the structure thereof and neutralization of charge is not needed. In view of the preservation stability of a coating solution for image-recording layer, preferable examples of the counter ion for $Za^-$ include a halide ion, a perchlorate ion, a tetrafluoroborate ion, a hexafluorophosphate ion and a sulfonate ion, and particularly preferable examples thereof include a perchlorate ion, a hexafluorophosphate ion and an arylsulfonate ion.

Specific examples of the cyanine dye represented by formula (a), which can be preferably used in the invention, include those described in Paragraph Nos. [0017] to [0019] of JP-A-2001-133969, Paragraph Nos. [0012] to [0021] of JP-A-2002-23360 and Paragraph Nos. [0012] to [0037] of JP-A-2002-40638.

The infrared absorbing dyes may be used individually or in combination of two or more thereof. Also, the infrared absorbing dye may be used together with an infrared absorbing agent other than the infrared absorbing dye, for example, a pigment. As the pigment, compounds described in Paragraph Nos. [0072] to [0076] of JP-A-2008-195018 are preferably used.

The content of the infrared absorbing dye in the image-recording layer according to the invention is preferably from 0.1 to 10.0% by weight, more preferably from 0.5 to 5.0% by weight, based on the total solid content of the image-recording layer.

(C) Radical Polymerization Initiator

The radical polymerization initiator (C) for use in the invention is a compound which initiates or accelerates polymerization of the radical polymerizable compound (D). The radical polymerization initiator for use in the invention includes, for example, known thermal polymerization initiators, compounds containing a bond having small bond dissociation energy and photopolymerization initiators.

The radical polymerization initiators in the invention include, for example, (a) organic halides, (b) carbonyl compounds, (c) azo compounds, (d) organic peroxides, (e) metallocene compounds, (f) azido compounds, (g) hexaarylbiimidazole compounds, (h) organic borate compounds, (i) disulfone compounds, (j) oxime ester compounds and (k) onium salt compounds.

As the organic halides (a), compounds described in Paragraph Nos. [0022] to [0023] of JP-A-2008-195018 are preferred.

As the carbonyl compounds (b), compounds described in Paragraph No. [0024] of JP-A-2008-195018 are preferred.

As the azo compounds (c), for example, azo compounds described in JP-A-8-108621 are used.

As the organic peroxides (d), for example, compounds described in Paragraph No. [0025] of JP-A-2008-195018 are preferred.

As the metallocene compounds (e), for example, compounds described in Paragraph No. [0026] of JP-A-2008-195018 are preferred.

As the azido compounds (f), compound, for example, 2,6-bis(4-azidobenzylidene)-4-methylcyclohexanone is exemplified.

As the hexaarylbiimidazole compounds (g), for example, compounds described in Paragraph No. [0027] of JP-A-2008-195018 are preferred.

As the organic borate compounds (h), for example, compounds described in Paragraph No. [0028] of JP-A-2008-195018 are preferred.

As the disulfone compounds (i), for example, compounds described in JP-A-61-166544 and JP-A-2002-328465 are exemplified.

As the oxime ester compounds (j), for example, compounds described in Paragraph Nos. [0028] to [0030] of JP-A-2008-195018 are preferred.

As the onium salt compounds (k), onium salts, for example, diazonium salts described in S. I. Schlesinger, *Photogr. Sci. Eng.,* 18, 387 (1974) and T. S. Bal et al., *Polymer,* 21, 423 (1980), ammonium salts described in U.S. Pat. No. 4,069,055 and JP-A-4-365049, phosphonium salts described in U.S. Pat. Nos. 4,069,055 and 4,069,056, iodonium salts described in European Patent 104,143, U.S. Patent Publication No. 2008/0311520, JP-A-2-150848 and JP-A-2008-195018, sulfonium salts described in European Patents 370,693, 390,214, 233,567, 297,443 and 297,442, U.S. Pat. Nos. 4,933,377, 4,760,013, 4,734,444 and 2,833,827, German Patents 2,904,626, 3,604,580 and 3,604,581, selenonium salts described in J. V. Crivello et al., *Macromolecules,* 10 (6), 1307 (1977) and J. V. Crivello et al., *J. Polymer Sci., Polymer Chem. Ed.,* 17, 1047 (1979), arsonium salts described in C. S. Wen et al., *Teh, Proc. Conf. Rad. Curing ASIA*, p. 478, Tokyo, Oct. (1988), and azinium salts described in JP-A-2008-195018 are exemplified.

Of the radical polymerization initiators, the onium salts, particularly, the iodonium salts, sulfonium salts and azinium salts are preferable. Specific examples of these compounds are set forth below, but the invention should not be construed as being limited thereto.

Of the iodonium salts, diphenyliodonium salts are preferred, diphenyliodonium salts substituted with an electron donating group, for example, an alkyl group or an alkoxy group are more preferred, and asymmetric diphenyliodonium salts are still more preferred. Specific examples thereof include diphenyliodonium hexafluorophosphate, 4-methoxyphenyl-4-(2-methylpropyl)phenyliodonium hexafluorophosphate, 4-(2-methylpropyl)phenyl-p-tolyliodonium hexafluorophosphate, 4-hexyloxyphenyl-2,4,6-trimethoxyphenyliodonium hexafluorophosphate, 4-hexyloxyphenyl-2,4-diethoxyphenyliodonium tetrafluoroborate, 4-octyloxyphenyl-2,4,6-trimethoxyphenyliodonium 1-perfluorobutanesulfonate, 4-octyloxyphenyl-2,4,6-trimethoxyphenyliodonium hexafluorophosphate and bis(4-tert-butylphenyl)iodonium tetraphenylborate.

Examples of the sulfonium salt include triphenylsulfonium hexafluorophosphate, triphenylsulfonium benzoylformate, bis(4-chlorophenyl)phenylsulfonium benzoylformate, bis(4-chlorophenyl)-4-methylphenylsulfonium tetrafluoroborate and tris(4-chlorophenyl)sulfonium 3,5-bis(methoxycarbonyl)benzenesulfonate.

Examples of the azinium salt include 1-cyclohexylmethyloxypyridinium hexafluorophosphate, 1-cyclohexyloxy-4-phenylpyridinium hexafluorophosphate, 1-ethoxy-4-phenylpyridinium hexafluorophosphate, 1-(2-ethylhexyloxy)-4-phenylpyridinium hexafluorophosphate, 4-chloro-1-cyclohexylmethyloxypyridinium hexafluorophosphate, 1-ethoxy-4-cyanopyridinium hexafluorophosphate, 3,4-dichloro-1-(2-ethylhexyloxy)pyridinium hexafluorophosphate, 1-benzyloxy-4-phenylpyridinium hexafluorophosphate, 1-phenethyloxy-4-phenylpyridinium hexafluorophosphate, 1-(2-ethylhexyloxy)-4-phenylpyridinium p-toluenesulfonate, 1-(2-ethylhexyloxy)-4-phenylpyridinium perfluorobutanesulfonate, 1-(2-ethylhexyloxy)-4-phenylpyridinium bromide and 1-(2-ethylhexyloxy)-4-phenylpyridinium tetrafluoroborate.

The radical polymerization initiator can be added to the image-recording layer preferably in an amount from 0.1 to 50% by weight, more preferably from 0.5 to 30% by weight, particularly preferably from 0.8 to 20% by weight, based on the total solid content constituting the image-recording layer. In the range described above, good sensitivity and good stain resistance in the non-image area at the time of printing are obtained.

(D) Radical Polymerizable Compound

The radical polymerizable compound (D) for use in the invention is an addition-polymerizable compound having at least one ethylenically unsaturated double bond, and it is preferably selected from compounds having at least one, preferably two or more, terminal ethylenically unsaturated double bonds. Such compounds are widely known in the field of art and they can be used in the invention without any particular limitation. The compound has a chemical form, for example, a monomer, a prepolymer, specifically, a dimer, a trimer or an oligomer, or a (co)polymer thereof, or a mixture thereof.

Specific examples of the radical polymerizable compound include compounds described in Paragraph Nos. [0089] to [0098] of JP-A-2008-195018. Among them, esters of aliphatic polyhydric alcohol compound with an unsaturated carboxylic acid (for example, acrylic acid, methacrylic acid, itaconic acid, crotonic acid, isocrotonic acid or maleic acid) are preferably exemplified. Other preferable radical polymerizable compound includes polymerizable compounds containing an isocyanuric acid structure described in JP-A-2005-329708.

In the invention, a polymerizable monomer having a urethane bond or an isocyanuric acid structure is preferably used and a polymerizable monomer having a urethane bond is more preferably used from the standpoint of printing durability. As a urethane compound having an ethylenically unsaturated group, a urethane type addition-polymerizable compound produced utilizing an addition reaction between an isocyanate and a hydroxy group is also preferably used in the invention. Specific examples thereof include a vinylurethane compound having two or more polymerizable vinyl groups per molecule obtained by adding a vinyl monomer containing a hydroxy group represented by formula (31) shown below to a polyisocyanate compound having two or more isocyanate groups per molecule, described in JP-B-48-41708 (the term "JP-B" as used herein means an "examined Japanese patent publication").

$CH_2{=}C(R^1)COOCH_2CH(R^2)OH$ Formula (31)

In formula (31), $R^1$ and $R^2$ each independently represents H or $CH_3$.

A urethane acrylate described in JP-A-7-247332 is also preferably used as the urethane compound having an ethylenically unsaturated group in the invention.

Specifically, the urethane acrylate is a radical curable urethane monomer (oligomer) and is preferably produced by reacting an organic diisocyanate with an ethylenically unsaturated alcohol represented by formula (32) shown below.

$R^1CH{=}C(R^2)COO{-}R^3{-}OH$ Formula (32)

In formula (31), $R^1$ represents a hydrogen atom, a methyl group or a benzyl group, $R^2$ represents a hydrogen atom or a methyl group, and $R^3$ represents an alkylene group.

Such a urethane acrylate is preferred since it is soluble in vinyl monomer, is cured by a method of free radical mechanism and is free from residual isocyanate.

The urethane acrylate which can be used in the invention includes, for example, a diacrylate, a triacrylate, a tetraacrylate and a hexaacrylate, and is preferably a reaction product between an aliphatic or aromatic polyvalent isocyanate and a monohydroxy group-containing monomer. For instance, it is a reaction product between Compound (A-A): at least one organic polyisocyanate compound and Compound (A-B): at least one α,β-ethylenically unsaturated alcohol.

The organic polyisocyanate compound which can be used as Compound (A-A) preferably has 2 to 6 reactive isocyanate groups. The isocyanate compound having two reactive isocyanate groups is represented by formula (33) shown below.

$OCN{-}R^1{-}NCO$ Formula (33)

In formula (33), $R^1$ represents a divalent aliphatic, alicyclic or aromatic group having at least 4 carbon atoms, which may have a substituent.

Preferable examples of the polyisocyanate compound include toluene-2,4-diisocyanate, 2,2,4-trimethylhexamethylene-1,6-diisocyanate, hexamethylene-1,6-diisocyanate, diphenylmethane-4,4'-diisocyanate, m-phenylene diisocyanate, p-phenylene diisocyanate, 2,6-tolylene diisocyanate, 1,4-cyclohexamethylenedimethyl diisocyanate, xylylene-1,4-diisocyanate, xylylene-1,3-diisocyanate, isophorone diisocyanate, 4,4'-methylenebis(cyclohexyl isocyanate), a reaction product between one of the polyisocyanate compounds described above and a polyamine or a low molecular weight polyol, for example, alkylene glycol, and an urethonimine which is obtained by heating one of the polyisocyanate compounds described above at high temperature in the presence of a phosphorus catalyst to prepare a polycarbodiimide and then reacting the polycarbodiimide with other isocyanate as described, for example, in U.S. Pat. No. 4,014,935.

The α,β-ethylenically unsaturated alcohol which can be used as Compound (A-B) preferably includes, for example, an alcohol as represented by formula (34) shown below.

$CH_2{=}C(R^2)COO{-}R^3{-}OH$ Formula (34)

In formula (34), $R^2$ represents H or $CH_3$, and $R^3$ represents an alkylene group or a residue derived from caprolactam.

Specific examples of the alcohol include 2-hydroxyethyl acrylate or methacrylate, 3-hydroxypropyl acrylate or methacrylate, 4-hydroxybutyl acrylate or methacrylate, a partial acrylate or methacrylate of polyhydroxy compound (for example, monoacrylate or monomethacrylate of ethylene glycol, 1,2-propylene glycol, 1,3-propylene glycol, 1,4-butylene glycol, 1,6-hexylene glycol, diethylene glycol, triethylene glycol or dipropylene glycol), and acrylate or methacrylate caped caprolactone alcohol.

Other alcohols include allyl alcohol, glycerol monoacrylate or monomethacrylate, pentaerythritol monoacrylate or monomethacrylate, acrylate or methacrylate caped caprolactone polyol, and acrylate or methacrylate caped polycaprolactone derivative as described in U.S. Pat. No. 3,700,643.

Of the urethane acrylates, a polymerizable compound represented by formula (35) shown below is particularly preferred.

Formula (35):

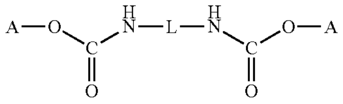

In formula (35), A represents a group containing 1 to 3 ethylenically unsaturated groups, and L represents an alkylene group having from 5 to 9 carbon atoms. A is preferably a group represented by formula (36) shown below.

$$-M{-}(X)_m \qquad \text{Formula (36)}$$

In formula (36), m represents an integer of 1 to 3, X represents an acryloyloxy group or a methacryloyloxy group and when plural Xs are present in formula (36), Xs may be the same or different, and M represents a connecting group formed by combination of groups shown below. Particularly, M is preferably an alkylene group having from 2 to 6 carbon atoms.

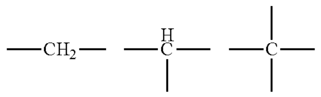

L is preferably an alkylene group having from 5 to 9 carbon atoms formed by combination of groups shown below.

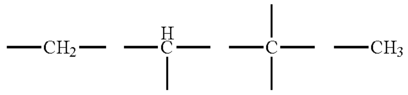

Preferable examples of the alkylene group represented by L include structures represented by formulae (37) and (38) shown below.

$$-(CH_2)_n- \qquad \text{Formula (37)}$$

Formula (38)

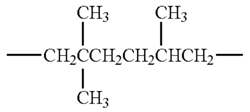

In formula (37), n represents an integer of 5 to 9. The alkylene group represented by L includes particularly preferably the alkylene group represented by formula (37) wherein n is 6 and the alkylene group represented by formula (38).

Specific examples of the radical polymerizable compound represented by formula (35) are set forth below, but the invention should not be construed as being limited thereto.

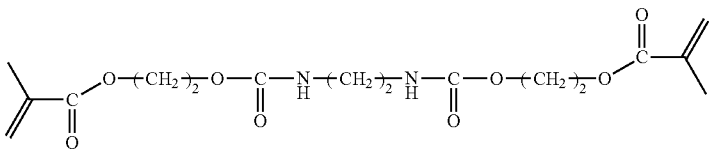

(U-1)

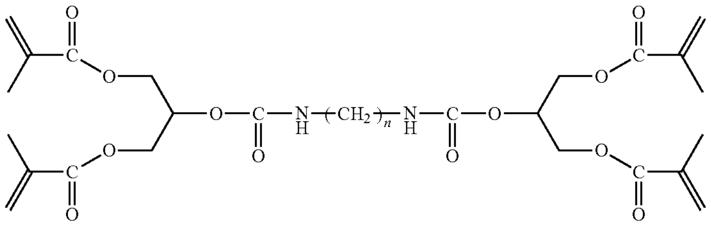

(U-2) n = 5
(U-3) n = 6
(U-4) n = 7
(U-5) n = 8

-continued
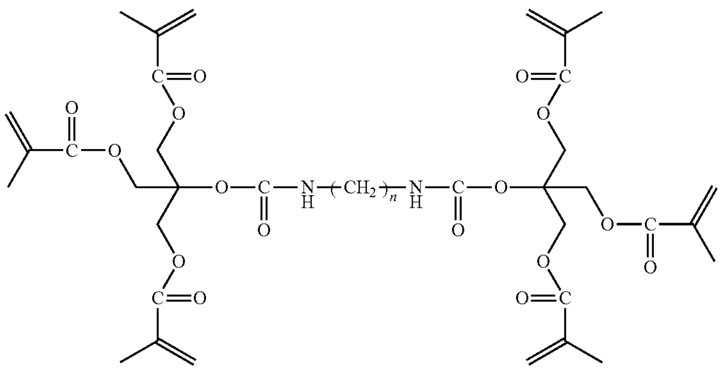
(U-6) n = 5
(U-7) n = 6
(U-8) n = 7
(U-9) n = 8
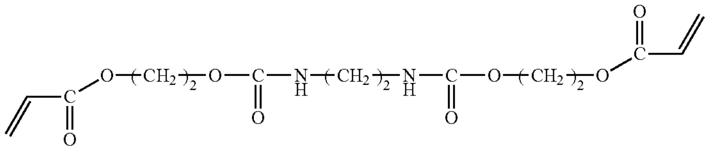
(U-10)
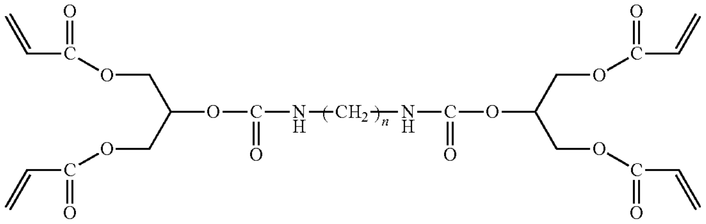
(U-11) n = 5
(U-12) n = 6
(U-13) n = 7
(U-14) n = 8
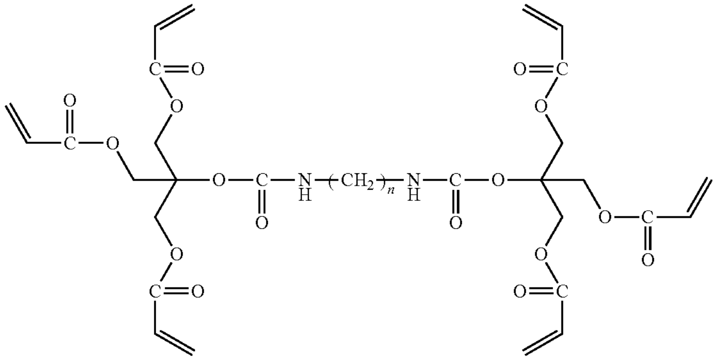
(U-15) n= 5
(U-16) n= 6
(U-17) n= 7
(U-18) n= 8
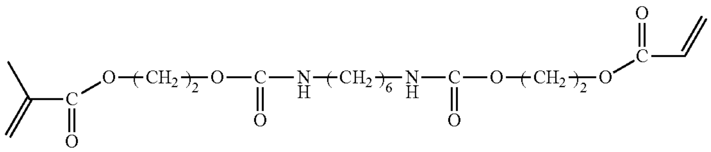
(U-19)

-continued
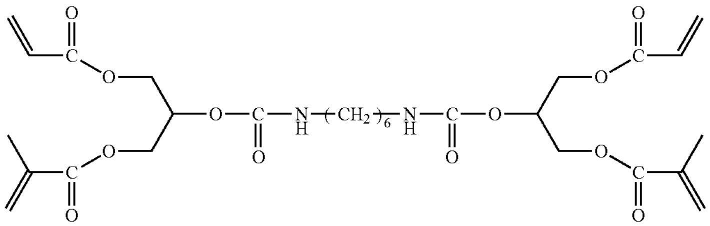
(U-20)
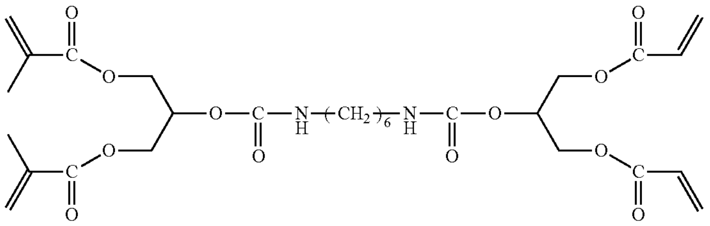
(U-21)
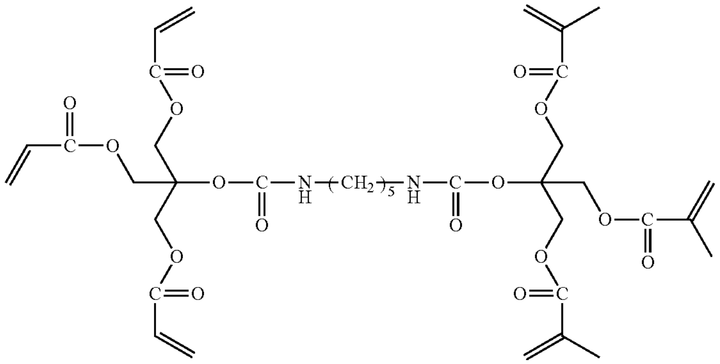
(U-22)
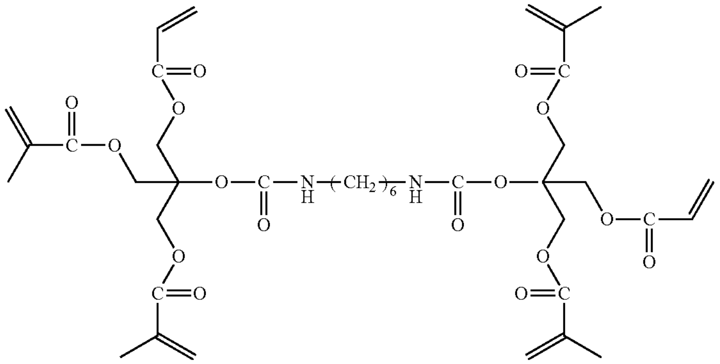
(U-23)
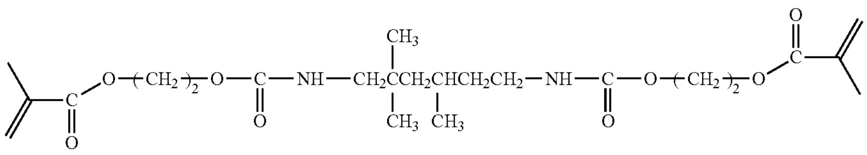
(U-24)
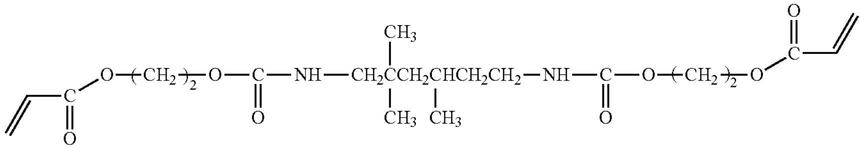
(U-25)

-continued

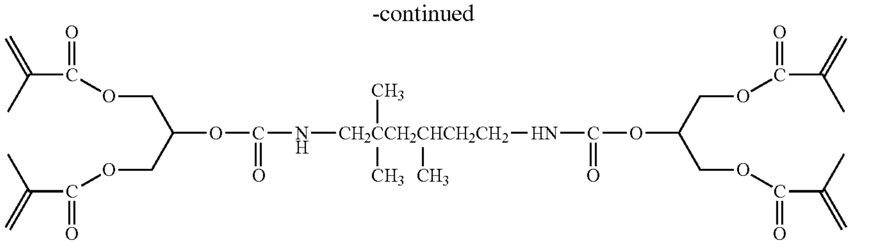

(U-26)

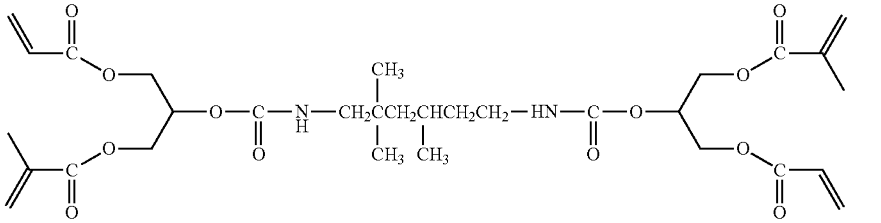

(U-27)

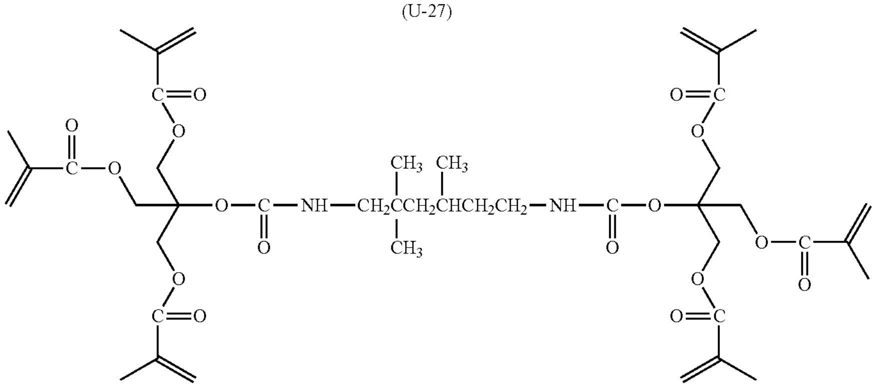

(U-28)

Particularly preferable examples of the radical polymerizable compound other than the urethane acrylate described above include an isocyanuric acid ethylene oxide-modified acrylate, for example, tris(acryloyloxyethyl)isocyanurate or bis(acryloyloxyethyl)hydroxyethyl isocyanurate.

In the invention, the radical polymerizable compound (D) is preferably used in an amount from 5 to 80% by weight, more preferably from 15 to 75% by weight, based on the total solid content of the image-recording layer. In the range described above, image formation is well conducted and good printing durability is obtained.

(E) Polymer Fine Particle

According to the invention, a polymer fine particle can be used in order to improve the on-press development property. The polymer fine particle for use in the invention is a fine particle which is capable of converting the image-recording layer to be hydrophobic due to fusion or reaction between the polymer fine particles when heat is applied, and it is also referred to as a hydrophobilizing precursor. The fine particle is preferably at least one fine particle selected from hydrophobic thermoplastic polymer fine particle, thermo-reactive polymer fine particle, microcapsule having a hydrophobic compound encapsulated and microgel (crosslinked polymer fine particle). Among them, polymer fine particle having a polymerizable group and microgel are preferred.

As the hydrophobic thermoplastic polymer fine particle, hydrophobic thermoplastic polymer fine particles described, for example, in *Research Disclosure*, No. 33303, January (1992), JP-A-9-123387, JP-A-9-131850, JP-A-9-171249, JP-A-9-171250 and European Patent 931,647 are preferably exemplified.

Specific examples of the polymer constituting the polymer fine particle include a homopolymer or copolymer of a monomer, for example, ethylene, styrene, vinyl chloride, methyl acrylate, ethyl acrylate, methyl methacrylate, ethyl methacrylate, vinylidene chloride, acrylonitrile, vinyl carbazole or an acrylate or methacrylate having a polyalkylene structure and a mixture thereof. Among them, polystyrene, a copolymer containing styrene and acrylonitrile and polymethyl methacrylate are more preferably exemplified.

The average particle size of the hydrophobic thermoplastic polymer fine particle for use in the invention is preferably from 0.01 to 2.0 μm.

The thermo-reactive polymer fine particle for use in the invention includes a polymer fine particle having a thermo-reactive group and forms a hydrophobilized region by crosslinkage due to thermal reaction and change in the functional group involved therein.

As the thermo-reactive group of the polymer fine particle having a thermo-reactive group for use in the invention, a functional group performing any reaction can be used as long as a chemical bond is formed. For instance, an ethylenically unsaturated group (for example, an acryloyl group, a methacryloyl group, a vinyl group or an allyl group) performing a radical polymerization reaction, a cationic polymerizable group (for example, a vinyl group or a vinyloxy group), an isocyanate group performing an addition reaction or a blocked form thereof, an epoxy group, a vinyloxy group and a functional group having an active hydrogen atom (for example, an amino group, a hydroxy group or a carboxyl group) as the reaction partner thereof, a carboxyl group performing a condensation reaction and a hydroxyl group or an amino group as the reaction partner thereof, and an acid anhydride performing a ring opening addition reaction and an amino group or a hydroxyl group as the reaction partner thereof are preferably exemplified.

As the microcapsule for use in the invention, microcapsule having all or part of the constituting components of the image-recording layer encapsulated as described, for example, in JP-A-2001-277740 and JP-A-2001-277742 is exemplified. The constituting components of the image-recording layer may be present outside the microcapsules. It is a more preferable embodiment of the image-recording layer containing microcapsules that hydrophobic constituting components are encapsulated in microcapsules and hydrophilic constituting components are present outside the microcapsules.

The image-recording layer according to the invention is an embodiment containing a crosslinked resin particle, that is, a microgel. The microgel can contain a part of the constituting components of the image-recording layer inside and/or on the surface thereof. Particularly, an embodiment of a reactive microgel containing the radical polymerizable compound (D) on the surface thereof is preferable from the standpoint of the image-forming sensitivity and printing durability.

As a method of microencapsulation or microgelation of the constituting components of the image-recording layer, known methods can be used.

The average particle size of the microcapsule or microgel is preferably from 0.01 to 3.0 μm, more preferably from 0.05 to 2.0 μm, particularly preferably from 0.10 to 1.0 μm. In the range described above, good resolution and good time-lapse stability can be achieved.

The content of the polymer fine particle is preferably in a range of 5 to 90% by weight based on the total solid content of the image-recording layer.

(F) Other Components

The image-recording layer according to the invention may further contain other components, if desired.

(1) Hydrophilic Low Molecular Weight Compound

The image-recording layer according to the invention may contain a hydrophilic low molecular weight compound in order to improve the on-press development property without accompanying the deterioration of the printing durability.

The hydrophilic low molecular weight compound includes a water-soluble organic compound, for example, a glycol compound, e.g., ethylene glycol, diethylene glycol, triethylene glycol, propylene glycol, dipropylene glycol or tripropylene glycol, or an ether or ester derivative thereof, a polyhydroxy compound, e.g., glycerine, pentaerythritol or tris(2-hydroxyethyl)isocyanurate, an organic amine compound, e.g., triethanolamine, diethanolamine or monoethanolamine, or a salt thereof, an organic sulfonic acid compound, e.g., an alkyl sulfonic acid, toluene sulfonic acid or benzene sulfonic acid, or a salt thereof, an organic sulfamic acid compound, e.g., an alkyl sulfamic acid, or a salt thereof, an organic sulfuric acid compound, e.g., an alkyl sulfuric acid or an alkyl ether sulfuric acid, or a salt thereof, an organic phosphonic acid compound, e.g., phenyl phosphonic acid, or a salt thereof, an organic carboxylic acid, e.g., tartaric acid, oxalic acid, citric acid, malic acid, lactic acid, gluconic acid or an amino acid, or a salt thereof and a betaine compound.

According to the invention, it is preferred that at least one compound selected from a polyol compound, an organic sulfate compound, an organic sulfonate compound and a betaine compound is incorporated.

Specific examples of the organic sulfonate compound include an alkylsulfonate, for example, sodium n-butylsulfonate, sodium n-hexylsulfonate, sodium 2-ethylhexylsulfonate, sodium cyclohexylsulfonate or sodium n-octylsulfonate, an alkylsulfonate containing an ethylene oxide chain, for example, sodium 5,8,11-trioxapentadecane-1-sulfonate, sodium 5,8,11-trioxaheptadecane-1-sulfonate, sodium 13-ethyl-5,8,11-trioxaheptadecane-1-sulfonate or sodium 5,8,11,14-tetraoxatetracosane-1-sulfonate, and an arylsulfonate, for example, sodium benzenesulfonate, sodium p-toluenesulfonate, sodium p-hydroxybenzenesulfonate, sodium p-styrenesulfonate, sodium isophthalic acid dimethyl-5-sulfonate, sodium 1-naphtylsulfonate, sodium 4-hydroxynaphtylsulfonate, disodium 1,5-naphthalenedisulfonate or trisodium 1,3,6-naphthalenetrisulfonate. The saltmay also be potassium salt or lithium salt.

The organic sulfate compound includes a sulfate of alkyl, alkenyl, alkynyl, aryl or heterocyclic monoether of polyethylene oxide. The number of unit of ethylene oxide is preferably from 1 to 4. The salt is preferably a sodium salt, a potassium salt or a lithium salt.

As the betaine compound, a compound wherein a number of carbon atoms included in a hydrocarbon substituent on the nitrogen atom is from 1 to 5 is preferred. Specific examples thereof include trimethylammonium acetate, dimethylpropylammonium acetate, 3-hydroxy-4-trimethylammoniobutyrate, 4-(1-pyridinio)butyrate, 1-hydroxyethyl-1-imidazolioacetate, trimethylammonium methanesulfonate, dimethylpropylammonium methanesulfonate, 3-trimethylammonio-1-porpanesulfonate and 3-(1-pyridinio)-1-porpanesulfonate.

The hydrophilic low molecular weight compound improves penetrability of dampening water into the unexposed area (non-image area) of the image-recording layer but does not deteriorate the hydrophobicity and film strength of the image area so that the ink receptive-property and printing durability of the image-recording layer can be preferably maintained.

The amount of the hydrophilic low molecular weight compound added to the image-recording layer is preferably from 0.5 to 20% by weight, more preferably from 1 to 10% by weight, still more preferably from 2 to 10% by weight, based on the total solid content of the image-recording layer. In the range described above, good on-press development property and good printing durability are achieved.

The hydrophilic low molecular weight compounds may be used individually or as a mixture of two or more thereof.

(2) Oil-Sensitizing Agent

In order to improve the ink-receptive property, an oil-sensitizing agent, for example, a phosphonium compound, a nitrogen-containing low molecular weight compound or an ammonium group-containing polymer can be used in the image-recording layer. In particular, in the case where an inorganic stratiform compound is incorporated into a protective layer described hereinafter, the oil-sensitizing agent functions as a surface covering agent of the inorganic stratiform compound and prevents deterioration of the ink-receptive property during printing due to the inorganic stratiform compound.

As preferable examples of the phosphonium compound, phosphonium compounds described in JP-A-2006-297907 and JP-A-2007-50660 are exemplified. Specific examples of the phosphonium compound include tetrabutylphosphonium iodide, butyltriphenylphosphonium bromide, tetraphenylphosphonium bromide, 1,4-bis(triphenylphosphonio)butane di(hexafluorophosphate), 1,7-bis(triphenylphosphonio) heptane sulfate and 1,9-bis(triphenylphosphonio)nonane naphthalene-2,7-disulfonate.

As the nitrogen-containing low molecular weight compound, an amine salt and a quaternary ammonium salt are exemplified. Also, an imidazolinium salt, a benzimidazolinium salt, a pyridinium salt and a quinolinium salt are exemplified. Of the nitrogen-containing low molecular weight compounds, the quaternary ammonium salt and pyridinium salt are preferably used. Specific examples the nitrogen-containing low molecular weight compound include tetramethylammonium hexafluorophosphate, tetrabutylammonium hexafluorophosphate, dodecyltrimethylammonium p-toluenesulfonate, benzyltriethylammonium hexafluorophosphate, benzyldimethyloctylammonium hexafluorophosphate and benzyldimethyldodecylammonium hexafluorophosphate.

The ammonium group-containing polymer may be any polymer containing an ammonium group in its structure and is preferably a polymer containing from 5 to 80% by mole of (meth)acrylate having an ammonium group in its side chain as a copolymerization component.

As to the ammonium group-containing polymer, its reduced specific viscosity value (unit: cSt/g/ml) determined according to the measurement method described below is preferably from to 120, more preferably from 10 to 110, particularly preferably from 15 to 100.

<Measurement Method of Reduced Specific Viscosity>

In a 20 ml measuring flask was weighed 3.33 g of a 30% polymer solution (1 g as a solid content) and the measuring flask was filled up to the gauge line with N-methylpyrrolidone. The resulting solution was put into an Ubbelohde viscometer (viscometer constant: 0.010 cSt/s) and a period for running down of the solution at 30° C. was measured. The viscosity was determined in a conventional manner according to the following calculation formula:

Kinetic viscosity=Viscometer constant×Period for liquid to pass through a capillary (sec)

Specific examples of the ammonium group-containing polymer are set forth below.

(1) 2-(Trimethylammonio)ethyl methacrylate p-toluenesulfonate/3,6-dioxaheptyl methacrylate copolymer (molar ratio: 10/90)

(2) 2-(Trimethylammonio)ethyl methacrylate hexafluorophosphate/3,6-dioxaheptyl methacrylate copolymer (molar ratio: 20/80)

(3) 2-(Ethyldimethylammonio)ethyl methacrylate p-toluenesulfonate/hexyl methacrylate copolymer (molar ratio: 30/70)

(4) 2-(Trimethylammonio)ethyl methacrylate hexafluorophosphate/2-ethylhexyl methacrylate copolymer (molar ratio: 20/80)

(5) 2-(Trimethylammonio)ethyl methacrylate methylsulfate/hexyl methacrylate copolymer (molar ratio: 40/60)

(6) 2-(Butyldimethylammonio)ethyl methacrylate hexafluorophosphate/3,6-dioxaheptyl methacrylate copolymer (molar ratio: 20/80)

(7) 2-(Butyldimethylammonio)ethyl acrylate hexafluorophosphate/3,6-dioxaheptyl methacrylate copolymer (molar ratio: 20/80)

(8) 2-(Butyldimethylammonio)ethyl methacrylate 13-ethyl-5,8,11-trioxa-1-heptadecanesulfonate/3,6-dioxahept yl methacrylate copolymer (molar ratio: 20/80)

(9) 2-(Butyldimethylammonio)ethyl methacrylate hexafluorophosphate/3,6-dioxaheptyl methacrylate/2-hydroxy-3-methacryloyloxypropyl methacrylate copolymer (molar ratio: 15/80/5)

The content of the oil-sensitizing agent is preferably from 0.01 to 30.0% by weight, more preferably from 0.1 to 15.0% by weight, still more preferably from 1 to 10% by weight, based on the total solid content of the image-recording layer.

(3) Other Components

Other components, for example, a surfactant, a coloring agent, a print-out agent, a polymerization inhibitor, a higher fatty acid derivative, a plasticizer, a fine inorganic particle, an inorganic stratiform compound, a co-sensitizer or a chain transfer agent may further be added to the image-recording layer. Specifically, compounds and amounts added thereof described, for example, in Paragraph Nos. [0114] to [0159] of JP-A-2008-284817, Paragraph Nos. [0023] to [0027] of JP-A-2006-91479 and Paragraph No. [0060] of U.S. Patent Publication No. 2008/0311520 are preferably used.

(G) Formation of Image-Recording Layer

The image-recording layer according to the invention is formed by dispersing or dissolving each of the necessary constituting components described above in a known solvent to prepare a coating solution and coating the solution on a support by a known method, for example, bar coater coating and drying as described in Paragraph Nos. [0142] to [0143] of JP-A-2008-195018. The coating amount (solid content) of the image-recording layer formed on a support after coating and drying may be varied according to the intended purpose but is in general preferably from 0.3 to 3.0 $g/m^2$. In the range described above, good sensitivity and good film property of the image-recording layer can be achieved.

(Undercoat Layer)

In the lithographic printing plate precursor according to the invention, an undercoat layer (also referred to as an intermediate layer) is preferably provided between the image-recording layer and the support. The undercoat layer strengthens adhesion between the support and the image-recording layer in the exposed area and makes removal of the image-recording layer from the support in the unexposed area easy, thereby contributing improvement in the developing property without accompanying degradation of the printing durability. Further, it is advantageous that in the case of infrared laser exposure, since the undercoat layer acts as a heat insulating layer, decrease in sensitivity due to diffusion of heat generated upon the exposure into the support is prevented.

As a compound for use in the undercoat layer, specifically, for example, a silane coupling agent having an addition-polymerizable ethylenic double bond reactive group described in JP-A-10-282679 and a phosphorus compound having an ethylenic double bond reactive group described in JP-A-2-304441 are exemplified. A polymer resin having an adsorbing group capable of adsorbing to a surface of the support, a hydrophilic group and a crosslinkable group as described in JP-A-2005-125749 and JP-A-2006-188038 is more preferably exemplified. The polymer resin is preferably a copolymer of a monomer having an adsorbing group, a monomer having a hydrophilic group and a monomer having a crosslinkable group. More specifically, a polymer resin which is a copolymer of a monomer having an adsorbing group, for example, a phenolic hydroxy group, a carboxyl group, $—PO_3H_2$, $—OPO_3H_2$, $—CONHSO_2—$, $—SO_2NHSO_2—$ or $—COCH_2COCH_3$, a monomer having a hydrophilic sulfo group and a monomer having a polymerizable crosslinkable group, for example, a methacryl group or an allyl group is preferred. The polymer resin may contain a crosslinkable group introduced by a salt formation between a polar substituent of the polymer resin and a compound containing a substituent having a counter charge to the polar substituent of the polymer resin and an ethylenically unsaturated bond and also may be further copolymerized with a monomer other than those described above, preferably a hydrophilic monomer.

The content of the unsaturated double bond in the polymer resin for undercoat layer is preferably from 0.1 to 10.0 mmol, most preferably from 2.0 to 5.5 mmol, based on 1 g of the polymer resin.

The weight average molecular weight of the polymer resin for undercoat layer is preferably 5,000 or more, more preferably from 10,000 to 300,000.

The undercoat layer according to the invention may contain a chelating agent, a secondary or tertiary amine, a polymerization inhibitor or a compound containing an amino group or a functional group having polymerization inhibition ability and a group capable of interacting with the surface of aluminum support (for example, 1,4-diazobicyclo[2,2,2]octane (DABCO), 2,3,5,6-tetrahydroxy-p-quinone, chloranil, sulfophthalic acid, hydroxyethylethylenediaminetriacetic acid, dihydroxyethylethylenediaminediacetic acid or hydroxyethyliminodiacetic acid) in addition to the compounds for the undercoat layer described above in order to prevent the occurrence of stain due to preservation of the lithographic printing plate precursor.

The undercoat layer is coated according to a known method. The coating amount (solid content) of the undercoat layer is preferably from 0.1 to 100 $mg/m^2$, and more preferably from 1 to 30 $mg/m^2$.

(Support)

As the support for use in the lithographic printing plate precursor according to the invention, a known support can be used. Particularly, an aluminum plate subjected to roughening treatment and anodizing treatment according to a known method is preferred.

Also, other treatments, for example, an enlarging treatment or a sealing treatment of micropores of the anodized film described in JP-A-2001-253181 and JP-A-2001-322365 or a surface hydrophilizing treatment, for example, with an alkali metal silicate as described in U.S. Pat. Nos. 2,714,066, 3,181,461, 3,280,734 and 3,902,734 or polyvinyl phosphonic acid as described in U.S. Pat. Nos. 3,276,868, 4,153,461 and 4,689,272 may be appropriately selected and applied to the aluminum plate, if desired.

The support preferably has a center line average roughness of 0.10 to 1.2 μm.

The support may have a backcoat layer containing an organic polymer compound described in JP-A-5-45885 or an alkoxy compound of silicon described in JP-A-6-35174, provided on the back surface thereof, if desired.

(Protective Layer)

As for the lithographic printing plate precursor according to the invention, it is preferred to provide a protective layer (overcoat layer) on the image-recording layer. The protective layer has a function for preventing, for example, occurrence of scratch in the image-recording layer or ablation caused by exposure with a high illuminance laser beam, in addition to the function for restraining an inhibition reaction against the image formation by means of oxygen blocking.

With respect to the protective layer having such properties, there are described, for example, in U.S. Pat. No. 3,458,311 and JP-B-55-49729 (the term "JP-B" as used herein means an "examined Japanese patent publication"). As a polymer having low oxygen permeability for use in the protective layer, any water-soluble polymer and water-insoluble polymer can be appropriately selected to use. Specifically, for example, polyvinyl alcohol, a modified polyvinyl alcohol, polyvinyl pyrrolidone, a water-soluble cellulose derivative and poly (meth) acrylonitrile are exemplified.

It is also preferred that the protective layer contains an inorganic stratiform compound, for example, natural mica or synthetic mica as described in JP-A-2005-119273 in order to increase the oxygen blocking property.

Further, the protective layer may contain a known additive, for example, a plasticizer for imparting flexibility, a surfactant for improving a coating property or a fine inorganic particle for controlling a surface slipping property. The oil-sensitizing agent described with respect to the image-recording layer may also be incorporated into the protective layer.

The protective layer is coated according to a known method. The coating amount of the protective layer is preferably in a range of 0.01 to 10 $g/m^2$, more preferably in a range of 0.02 to 3 $g/m^2$, most preferably in a range of 0.02 to 1 $g/m^2$, in terms of the coating amount after drying.

[Plate Making Method]

Plate making of the lithographic printing plate precursor according to the invention is preferably performed by an on-press development method. The on-press development method includes a step in which the lithographic printing plate precursor is imagewise exposed and a printing step in which oily ink and an aqueous component are supplied to the exposed lithographic printing plate precursor without undergoing any development processing to perform printing, and it is characterized in that the unexposed area of the lithographic printing plate precursor is removed in the course of the printing step. The imagewise exposure may be performed on a printing machine after the lithographic printing plate precursor is mounted on the printing machine or may be separately performed using a platesetter or the like. In the latter case, the exposed lithographic printing plate precursor is mounted as it is on a printing machine without undergoing a development processing step. Then, the printing operation is initiated using the printing machine with supplying oily ink and an aqueous component and at an early stage of the printing the on-press development is carried out. Specifically, the image-recording layer in the unexposed area is removed and the hydrophilic surface of support is revealed therewith to form the non-image area. As the oily ink and aqueous component, printing ink and dampening water for conventional lithographic printing can be employed, respectively.

The on-press development method is described in more detail below.

The light source used for the image exposure in the invention is preferably a laser. The laser for use in the invention is not particularly restricted and preferably includes, for example, a solid laser or semiconductor laser emitting an infrared ray having a wavelength of 760 to 1,200 nm.

With respect to the infrared ray laser, the output is preferably 100 mW or more, the exposure time per pixel is preferably within 20 microseconds, and the irradiation energy is preferably from 10 to 300 $mJ/cm^2$. With respect to the laser exposure, in order to shorten the exposure time, it is preferred to use a multibeam laser device.

The exposed lithographic printing plate precursor is mounted on a plate cylinder of a printing machine. In case of using a printing machine equipped with a laser exposure apparatus, the lithographic printing plate precursor is mounted on a plate cylinder of the printing machine and then subjected to the imagewise exposure.

When dampening water and printing ink are supplied to the imagewise exposed lithographic printing plate precursor to perform printing, in the exposed area of the image-recording layer, the image-recording layer cured by the exposure forms the printing ink receptive area having the oleophilic surface. On the other hand, in the unexposed area, the uncured image-recording layer is removed by dissolution or dispersion with the dampening water and/or printing ink supplied to reveal the hydrophilic surface in the area. As a result, the dampening water adheres on the revealed hydrophilic surface and the printing ink adheres to the exposed area of the image-recording layer, whereby printing is initiated.

While either the dampening water or printing ink may be supplied at first on the surface of lithographic printing plate precursor, it is preferred to supply the printing ink at first in view of preventing the dampening water from contamination with the component of the image-recording layer removed.

Thus, the lithographic printing plate precursor according to the invention is subjected to the on-press development on an offset printing machine and used as it is for printing a large number of sheets.

EXAMPLES

The present invention will be described in more detail with reference to the following examples, but the invention should not be construed as being limited thereto.

Examples 1 to 14 and Comparative Examples 1 to 6

1. Preparation of Lithographic Printing Plate Precursor (1) Preparation of Support An aluminum plate (material: JIS A 1050) having a thickness of 0.3 mm was subjected to a degreasing treatment at 50° C. for 30 seconds using a 10% by weight aqueous sodium aluminate solution in order to remove rolling oil on the surface thereof and then grained the surface thereof using three nylon brushes embedded with bundles of nylon bristle having a diameter of 0.3 mm and an aqueous suspension (specific gravity: 1.1 g/cm$^3$) of pumice having a median size of 25 μm, followed by thorough washing with water. The plate was subjected to etching by immersing in a 25% by weight aqueous sodium hydroxide solution of 45° C. for 9 seconds, washed with water, then immersed in a 20% by weight aqueous nitric acid solution at 60° C. for 20 seconds, and washed with water. The etching amount of the grained surface was about 3 g/m$^2$.

Then, using an alternating current of 60 Hz, an electrochemical roughening treatment was continuously carried out on the plate. The electrolytic solution used was a 1% by weight aqueous nitric acid solution (containing 0.5% by weight of aluminum ion) and the temperature of electrolytic solution was 50° C. The electrochemical roughening treatment was conducted using an alternating current source, which provides a rectangular alternating current having a trapezoidal waveform such that the time TP necessary for the current value to reach the peak from zero was 0.8 msec and the duty ratio was 1:1, and using a carbon electrode as a counter electrode. A ferrite was used as an auxiliary anode. The current density was 30 A/dm$^2$ in terms of the peak value of the electric current, and 5% of the electric current flowing from the electric source was divided to the auxiliary anode. The quantity of electricity in the nitric acid electrolysis was 175 C/dm$^2$ in terms of the quantity of electricity when the aluminum plate functioned as an anode. The plate was then washed with water by spraying.

The plate was further subjected to an electrochemical roughening treatment in the same manner as in the nitric acid electrolysis above using as an electrolytic solution, a 0.5% by weight aqueous hydrochloric acid solution (containing 0.5% by weight of aluminum ion) having temperature of 50° C. and under the condition that the quantity of electricity was 50 C/dm$^2$ in terms of the quantity of electricity when the aluminum plate functioned as an anode. The plate was then washed with water by spraying.

The plate was then subjected to an anodizing treatment using as an electrolytic solution, a 15% by weight aqueous sulfuric acid solution (containing 0.5% by weight of aluminum ion) at a current density of 15 A/dm$^2$ to form a direct current anodized film of 2.5 g/m$^2$, washed with water and dried to prepare Support (1).

Thereafter, in order to ensure the hydrophilicity of the non-image area, Support (1) was subjected to silicate treatment using a 2.5% by weight aqueous sodium silicate No. 3 solution at 60° C. for 10 seconds and then washed with water to obtain Support (2). The adhesion amount of Si was 10 mg/m$^2$. The center line average roughness (Ra) of the support was measured using a stylus having a diameter of 2 μm and found to be 0.51 μm.

(2) Formation of Undercoat Layer

Coating solution (1) for undercoat layer shown below was coated on Support (2) so as to have a dry coating amount of 20 mg/m$^2$ to prepare a support having an undercoat layer for using the experiments described below.

<Coating Solution (1) for Undercoat Layer>

| | |
|---|---|
| Compound (1) for undercoat layer having structure shown below | 0.18 g |
| Hydroxyethyliminodiacetic acid | 0.10 g |
| Methanol | 55.24 g |
| Water | 6.15 g |

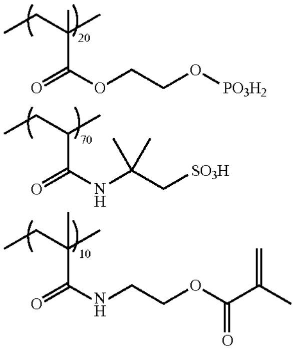

(Mw: 1000,000)

Compound (1) for undercoat layer (3) Formation of Image-Recording Layer

Coating solution (1) for image-recording layer having the composition shown below was coated on the undercoat layer described above by a bar and dried in an oven at 100° C. for 60 seconds to form an image-recording layer having a dry coating amount of 1.0 g/m$^2$.

Coating solution (1) for image-recording layer was prepared by mixing Photosensitive solution (1) shown below with Microgel solution (1) shown below just before the coating, followed by stirring.

| <Photosensitive solution (1)> | |
|---|---|
| Binder polymer (1) according to invention (Binder polymer shown in Table 4) | 0.240 g |
| Infrared absorbing dye (1) having structure shown below | 0.030 g |
| Radical polymerization initiator (1) having structure shown below | 0.162 g |

-continued

| <Photosensitive solution (1)> | |
|---|---|
| Radical polymerizable compound (U-24) | 0.192 g |
| Hydrophilic low molecular weight compound (Tris(2-hydroxyethyl) isocyanurate) | 0.062 g |
| Hydrophilic low molecular weight compound (1) having structure shown below | 0.050 g |
| Oil-sensitizing agent (Phosphonium compound (1) having structure shown below) | 0.055 g |
| Oil-sensitizing agent (Benzyl dimethyl octyl ammonium $PF_6$ salt | 0.018 g |
| Oil-sensitizing agent (Ammonium group-containing polymer having structure shown below (reduced specific viscosity: 44 cSt/g/ml) | 0.035 g |
| Fluorine-based surfactant (1) having structure shown below | 0.008 g |
| 2-Butanone | 1.091 g |
| 1-Methoxy-2-propanol | 8.609 g |

| <Microgel solution (1)> | |
|---|---|
| Microgel (1) shown below | 2.640 g |
| Distilled water | 2.425 g |

The structures of Infrared absorbing dye (1), Radical polymerization initiator (1), Phosphonium compound (1), Hydrophilic low molecular weight compound (1), Ammonium group-containing polymer and Fluorine-based surfactant (1) are shown below.

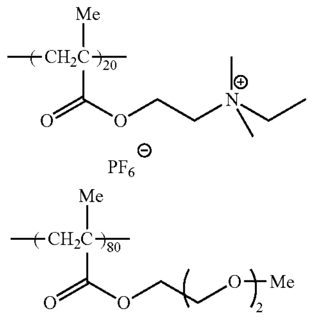

Ammonium group-containing polymer

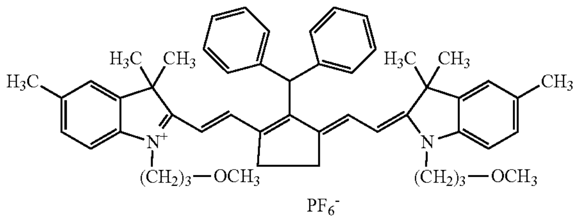

Infrared absorbing dye (1)

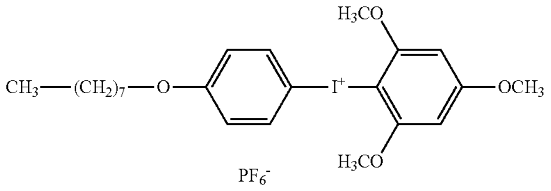

Radical polymerization intitator (1)

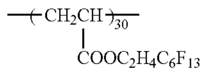

-continued

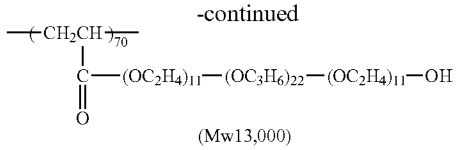

(Mw13,000)

Fluorine-based surfactant (1)

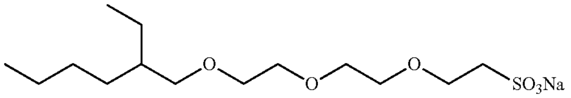

Hydrophilic low molecular weight compound (1)

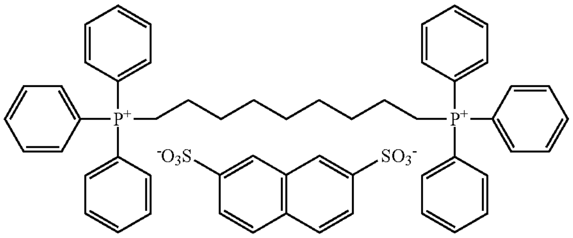

Phosphonium compound (1)

<Preparation of Microgel (1)>

An oil phase component was prepared by dissolving 10 g of adduct of trimethylol propane and xylene diisocyanate (TAKENATE D-110N, produced by Mitsui Chemicals Polyurethanes, Inc.), 3.15 g of pentaerythritol triacrylate (SR444, produced by Nippon Kayaku Co., Ltd.) and 0.1 g of PIONIN A-41C (produced by Takemoto Oil & Fat Co., Ltd.) in 17 g of ethyl acetate. As an aqueous phase component, 40 g of a 4% by weight aqueous solution of polyvinyl alcohol (PVA-205, produced by Kuraray Co., Ltd.) was prepared. The oil phase component and the aqueous phase component were mixed and emulsified using a homogenizer at 12,000 rpm for 10 minutes. The resulting emulsion was added to 25 g of distilled water and stirred at room temperature for 30 minutes and then at 50° C. for 3 hours. The microgel liquid thus-obtained was diluted using distilled water so as to have the solid concentration of 15% by weight to prepare Microgel (1). The average particle size of the microgel was measured by a light scattering method and found to be 0.2 μm.

(4) Formation of Protective Layer

Coating solution (1) for protective layer having the composition shown below was coated on the image-recording layer described above by a bar and dried in an oven at 120° C. for 60 seconds to form a protective layer having a dry coating amount of 0.15 g/$m^2$, thereby preparing Lithographic printing plate precursors (1) to (20), respectively.

| <Coating solution (1) for protective layer> | |
|---|---|
| Dispersion of inorganic stratiform compound (1) shown below | 1.5 g |
| Aqueous 6% by weight solution of polyvinyl alcohol (CKS 50, sulfonic acid-modified, saponification degree: 99% by mole or more, polymerization degree: 300, produced by Nippon Synthetic Chemical Industry Co., Ltd.) | 0.55 g |
| Aqueous 6% by weight solution of polyvinyl alcohol (PVA-405, saponification degree: 81.5% by mole, polymerization degree: 500, produced by Kuraray Co., Ltd.) | 0.03 g |

-continued

| <Coating solution (1) for protective layer> | |
|---|---|
| Aqueous 1% by weight solution of surfactant (EMALEX 710, produced by Nihon Emulsion Co., Ltd.) | 0.86 g |
| Ion-exchanged water | 6.0 g |

<Preparation of Dispersion of Inorganic Stratiform Compound (1)>

To 193.6 g of ion-exchanged water was added 6.4 g of synthetic mica (SOMASIF ME-100, produced by CO—OP Chemical Co., Ltd.) and the mixture was dispersed using a homogenizer until an average particle size (according to a laser scattering method) became 3 μm to prepare Dispersion of inorganic stratiform compound (1). The aspect ratio of the inorganic particle thus-dispersed was 100 or more.

Lithographic printing plate precursors (15) to (20) described above are lithographic printing plate precursors for comparison. Lithographic printing plate precursors (15) to (20) were prepared in the same manner as in the preparation of Lithographic printing plate precursor (1) except for using Binder polymers B-1 to B-6 shown in Table 3 below in place of the binder polymer according to the invention, respectively. Binder polymers B-1 to B-5 are urethane binders having no polyalkylene oxide chain in their side chains and an acrylic binder, respectively. Binder polymer B-6 is a urethane binder in which acrylate group is added to terminal of diethylene oxide chain.

TABLE 3

| Binder Polymer | Diisocyanate Compound Used (% by mole) | Diol Compound Used (% by mole) | Mw |
|---|---|---|---|
| B-1 | 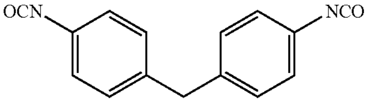<br>40<br>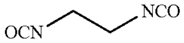<br>10 | 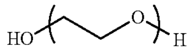<br>45<br>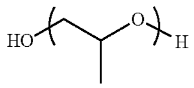<br>5 | 120,000 |
| B-2 | 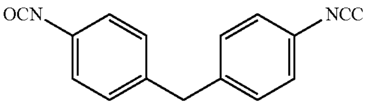<br>50 | 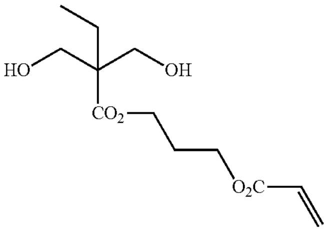<br>25<br>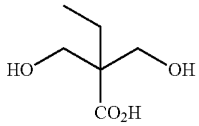<br>17.5<br>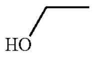<br>7.5 | 4,000 |
| B-3 | 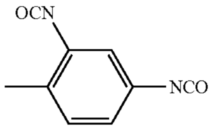<br>50 | 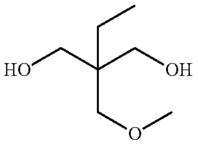<br>45<br>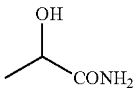<br>5 | 110,000 |

TABLE 3-continued

| Binder Polymer | Diisocyanate Compound Used (% by mole) | Diol Compound Used (% by mole) | Mw |
|---|---|---|---|
| B-4 | 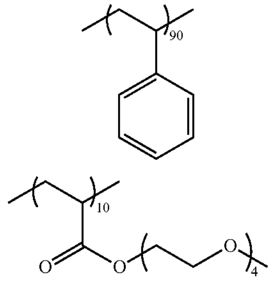 Graft copolymer | | 80,000 |

Binder Polymer B-5 for Comparison (n≈10, Molecular Weight: 120,000):

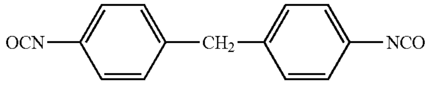

40% by mole $OCN(CH_2)_6NCO$

10% by mole

Diisocyanate Compound $HO(CH_2CH_2O)_4OH$ $HO[CH_2CH(CH_3)O]_nOH$ 48.5% by mole 1.5% by mole Diol Compound (n ≈ 10)

Binder Polymer B-6 for Comparison (Molecular Weight: 100,000):

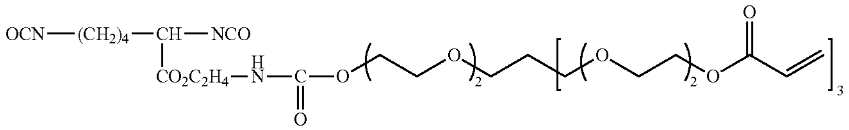

20% by mole

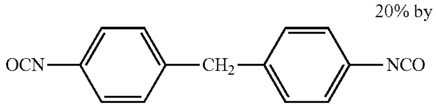

30% by mole

Diisocyanate Compound $HO(CH_2CH_2O)_4OH$ $HO[CH_2CH(CH_3)O]_nOH$

45% by mole 5% by mole

Diol Compound (n ≈ 10)

2. Evaluation of Lithographic Printing Plate Precursor (1) On-Press Development Property Each of the lithographic printing plate precursors thus-obtained was exposed by LUXEL PLATESETTER T-6000III equipped with an infrared semiconductor laser, produced by Fujifilm Corp. under the conditions of a rotational number of an external drum of 1,000 rpm, laser output of 70% and resolution of 2,400 dpi. The exposed image contained a solid image and a 50% halftone dot chart of a 20 μm-dot FM screen.

The exposed lithographic printing plate precursor was mounted without undergoing development processing on a plate cylinder of a printing machine (LITHRONE 26, produced by Komori Corp.). Using dampening water (ECOLITY-2 (produced by Fujifilm Corp.)/tap water=2/98 (volume ratio)) and VALUES-G (N) Black Ink (produced by Dainippon Ink & Chemicals, Inc.), the dampening water and ink were supplied according to the standard automatic printing start method of LITHRONE 26 to conduct printing on 100 sheets of TOKUBISHI ART PAPER (76.5 kg) at a printing speed of 10,000 sheets per hour.

A number of the printing papers required until the on-press development of the unexposed area of the image-recording layer on the printing machine was completed to reach a state where the ink was not transferred to the printing paper in the non-image area was measured to evaluate the on-press development property. The results obtained are shown in Table 4.

(2) Printing Durability

After performing the evaluation for the on-press development property described above, the printing was continued. As the increase in a number of printing papers, the image-recording layer was gradually abraded to cause decrease in the ink density on the printing paper. A number of the printing papers wherein a value obtained by measuring a halftone dot area rate of the 50% halftone dot of FM screen on the printing paper using a Gretag densitometer decreased by 5% from the value measured on the 100$^{th}$ paper of the printing was determined to evaluate the printing durability. The results obtained are shown in Table 4.

(3) Printing Stain

The lithographic printing plate was subjected to the printing under the condition described above and after printing 10,000 sheets, the stain on a blanket corresponding to the non-image area was transferred to a tape and evaluated on a scale of one to five as shown below.

5: Ink stain area per $cm^2$ was 2% or less.
4: Ink stain area per cm was 5% or less.
3: Ink stain area per $cm^2$ was 10% or less.
2: Ink stain area per $cm^2$ was less than 15%.
1: Ink stain area per $cm^2$ was 15% or more.

(4) On-Press Development Scum

The lithographic printing plate was subjected to the printing under the condition described above and after printing 10,000 sheets, the on-press development scum on the non-image area was visually evaluated. Specifically, after printing 10,000 sheets, the scum on the water supplying roller was transferred to a tape and observed using a microscope to evaluate on a scale of one to five as shown below.

5: Number of scum having a length of 3 micrometers or longer per $cm^2$ was 5 or less.
4: Number of scum having a length of 3 micrometers or longer per $cm^2$ was 10 or less.
3: Number of scum having a length of 3 micrometers or longer per $cm^2$ was 20 or less.
2: Number of scum having a length of 3 micrometers or longer per $cm^2$ was less than 50.
1: Number of scum having a length of 3 micrometers or longer per $cm^2$ was 50 or more.

TABLE 4

| | | | Evaluation Result of Printing | | | |
|---|---|---|---|---|---|---|
| | Lithographic Printing Plate Precursor | Binder Polymer | Printing Durability ($\times 10^4$ sheets) | On-press Development Property (sheets) | Printing Stain | On-press Development Scum |
| Example 1 | 1 | 1 | 6.5 | 7 | 5 | 5 |
| Example 2 | 2 | 2 | 5.9 | 8 | 5 | 5 |
| Example 3 | 3 | 3 | 5.8 | 10 | 5 | 5 |
| Example 4 | 4 | 4 | 5.2 | 22 | 5 | 5 |
| Example 5 | 5 | 5 | 5.0 | 13 | 5 | 5 |
| Example 6 | 6 | 6 | 5.0 | 25 | 5 | 5 |
| Example 7 | 7 | 7 | 6.5 | 7 | 5 | 5 |
| Example 8 | 8 | 8 | 6.4 | 6 | 5 | 5 |
| Example 9 | 9 | 9 | 5.0 | 14 | 5 | 5 |
| Example 10 | 10 | 10 | 5.4 | 14 | 5 | 5 |
| Example 11 | 11 | 11 | 4.7 | 24 | 5 | 5 |
| Example 12 | 12 | 12 | 4.6 | 23 | 5 | 5 |
| Example 13* | 13 | 1 | 5.5 | 7 | 5 | 5 |
| Example 14* | 14 | 1 | 4.0 | 27 | 5 | 5 |
| Comparative Example 1 | 15 | B-1 | 2.9 | 34 | 4 | 3 |
| Comparative Example 2 | 16 | B-2 | 3.2 | 34 | 4 | 3 |
| Comparative Example 3 | 17 | B-3 | 3.1 | 38 | 4 | 2 |
| Comparative Example 4 | 18 | B-4 | 2.5 | 45 | 3 | 3 |
| Comparative Example 5 | 19 | B-5 | 3.0 | 35 | 4 | 3 |
| Comparative Example 6 | 20 | B-6 | 3.2 | 45 | 3 | 3 |

*In Examples 13 and 14, tris(acryloyloxyethyl)isocyanurate (NK ESTER A-9300, produced by Shin-Nakamura Chemical Co., Ltd.) and (x-1) shown below were used in place of (U-24) as the radical polymerizable compound, respectively.

(x-1)

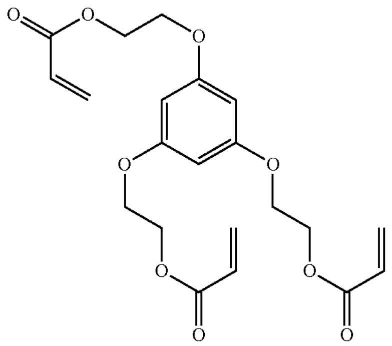

From the results shown in Table 4, it can be seen that the on-press development property is remarkably improved by using the urethane resin binder having an ethylene oxide chain in its side chain according to the invention. It is also found that the unexpected result in that the on-press development scum is considerably reduced and the printing durability is improved is obtained in addition to the advantage in the on-press development property in comparison with the case where the urethane resin binder having an ethylene oxide chain in its main chain is used. Furthermore, It is also found that the unexpected result in that the printing durability and the on-press development property are improved is obtained in comparison with the case where the urethane binder having a diethylene oxide chain having, at its terminal, an acrylate group is used.

Examples 15 to 16 and Comparative Examples 7 to 8

1. Preparation of Lithographic Printing Plate Precursors (21) to (24)

Coating solution (2) for image-recording layer having the composition shown below was coated on the support provided with the undercoat layer same as used in Example 1 by a bar and dried in an oven at 70° C. for 60 seconds to form an image-recording layer having a dry coating amount of 0.6 g/m$^2$, thereby preparing Lithographic printing plate precursors (21) to (24), respectively.

| <Coating solution (2) for image-recording layer> | |
|---|---|
| Aqueous dispersion of polymer fine particle (1) shown below | 20.0 g |
| Infrared absorbing dye (2) having structure shown below | 0.2 g |
| Radical polymerization initiator (IRGACURE 250, produced by Ciba Specialty Chemicals, Inc.) | 0.5 g |
| Radical polymerizable compound (U-24) | 1.5 g |
| Mercapto-3-triazole | 0.2 g |
| Binder polymer shown in Table 5 | 7.7 g |
| n-Propanol | 55.0 g |
| n-Butanone | 17.0 g |

The compound indicated using its trade name in the composition above is shown below.

IRGACURE 250:

4-Methoxyphenyl)[4-(2-methylpropyl)phenyl]iodonium hexafluorophosphate (75% by Weight Propylene Carbonate Solution)

Infrared absorbing dye (2):

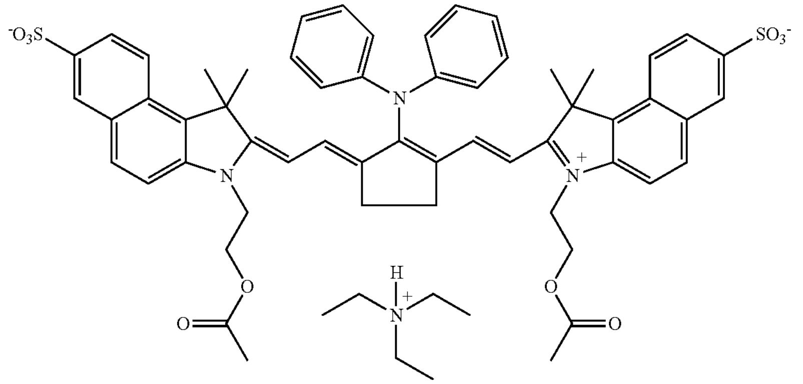

(Preparation of Aqueous Dispersion of Fine Polymer Particle (1))

A stirrer, a thermometer, a dropping funnel, a nitrogen inlet tube and a reflux condenser were attached to a 1,000 ml four-neck flask and while carrying out deoxygenation by introduction of nitrogen gas, 10 g of polyethylene glycol methyl ether methacrylate (PEGMA, average number of ethylene glycol repeating units: 50), 200 g of distilled water and 200 g of n-propanol were charged therein and heated until the internal temperature reached 70° C. Then, a mixture of 10 g of styrene (St), 80 g of acrylonitrile (AN) and 0.8 g of 2,2'-azobisisobutyronitrile previously prepared was dropwise added to the flask over a period of one hour. After the completion of the dropwise addition, the reaction was continued as it was for 5 hours. Then, 0.4 g of 2,2'-azobisisobutyronitrile was added and the internal temperature was raised to 80° C. Thereafter, 0.5 g of 2,2'-azobisisobutyronitrile was added over a period of 6 hours. At the stage after reacting for 20 hours in total, the polymerization proceeded 98% or more to obtain Aqueous dispersion of fine polymer particle (1) of PEGMA/St/AN (Oct. 10, 1980 in a weight ratio). The particle size distribution of the fine polymer particle had the maximum value at the particle size of 150 nm.

The particle size distribution was determined by taking an electron microphotograph of the fine polymer particle, measuring particle sizes of 5,000 fine particles in total on the photograph, and dividing a range from the largest value of the particle size measured to 0 on a logarithmic scale into 50 parts to obtain occurrence frequency of each particle size by plotting. With respect to the aspherical particle, a particle size of a spherical particle having a particle area equivalent to the particle area of the aspherical particle on the photograph was defined as the particle size.

Polymer U

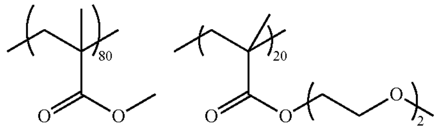

Molecular weight: 15,000

2. Plate Making and Printing

The lithographic printing plate precursor thus-obtained was subjected to the image exposure and printing in the same manner as in Example 1 and evaluated in the same manner as in Example 1. The results obtained are shown in Table 5.

TABLE 5

| | Lithographic Printing Plate Precursor | Binder Polymer | Evaluation Result of Printing: Printing Durability ($\times 10^4$ sheets) | On-press Development Property (sheets) | Printing Stain | On-press Development Scum |
|---|---|---|---|---|---|---|
| Example 15 | 21 | 1 | 5.5 | 13 | 5 | 5 |
| Example 16 | 22 | 7 | 5.8 | 9 | 5 | 5 |
| Comparative Example 7 | 23 | Polymer U | 3.3 | 39 | 3 | 2 |
| Comparative Example 8 | 24 | B-2 (shown in Table 3) | 4.3 | 48 | 3 | 3 |

From the results shown in Table 5, it can be seen that the urethane resin binder having an ethylene oxide chain in its side chain according to the invention can also be preferably used in the lithographic printing plate precursor containing the polymer fine particle and is excellent in the printing durability, on-press development property, printing stain and on-press development scum in comparison with the cases where the urethane resin binder having an ethylene oxide in its main chain and the acrylic binder having an ethylene oxide in its side chain are used, respectively.

Examples 17 to 18 and Comparative Examples 9 to 10

1. Synthesis of Graft Copolymer (B-7)

(1) Synthesis of Macromer 1

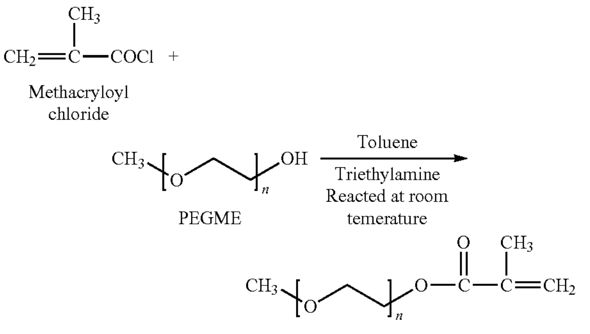

Methacryloyl chloride

PEGME

Macromer 1

Into a 500 ml flask was charged 266 g of toluene and under nitrogen atmosphere, 80 g of polyethylene glycol monomethyl ether (Mn: 2,000) and 4.2 g of methacryloyl chloride were added thereto. Then, while maintaining the reaction temperature at 30° C., 4.52 g of triethylamine was added over a period of 20 minutes. After the lapse of 2 hours, the temperature of reaction mixture was raised to 50° C. and maintained at that temperature for 2 hours. Thereafter, the reaction mixture was cooled to room temperature and filtered to remove the triethylamine hydrochloride which was obtained in the theoretical amount. Petroleum ether was added to the filtrate to precipitate Macromer 1 which was collected by filtration and dried in vacuum oven at room temperature. The reaction is shown in the scheme above. The average value of n is preferably about 45.

(2) Synthesis of Graft Copolymer (B-7)

Into a 500 ml flask were charged 7.5 g of Macromer 1, 48 g of water and 192 g of 1-propanol and the mixture was heated to 80° C. In a separate beaker were mixed 66.9 g of styrene and 0.48 g of azobisisobutyronitrile (VAZO-64, available from DuPont de Nemours Co.) to prepare a solution and a part (12 g) of the solution was added to the macromer solution, and the mixture became cloudy within about 10 minutes. Then, the remaining solution was added over a period of 30 minutes. After the lapse of 3 hours, the conversion to Graft copolymer (B-7) was about 97% based on determination of percent non-volatiles. The weight ratio of styrene:Macromer 1 was about 90:10 in Graft copolymer (B-7).

(3) Preparation of Lithographic Printing Plate Precursors

Coating solution (3) for image-recording layer having the composition shown below was coated on the support provided with the undercoat layer same as used in Example 1 to form an image-recording layer having a dry coating amount of 2 g/m$^2$.

| <Coating solution (3) for image-recording layer> | |
|---|---|
| Reaction product of DESMODUR ® N100 with hydroxyethyl acrylate and pentaerythritol triacrylate (*1) | 3.74 parts by weight |
| Binder polymer shown in Table 6 | 3.53 parts by weight |
| Radical polymerizable compound (U-25) | 0.78 parts by weight |
| Radical polymerization initiator [2-(4-methoxyphenyl)-4,6-bis(trichloromethyl)-1,3,5-triazine] | 0.42 parts by weight |
| Anilino-N,N-diacetic acid | 0.23 parts by weight |
| Infrared absorbing dye (3) (*2) | 0.09 parts by weight |
| BYK 307 (*3) | 0.02 parts by weight |
| n-Propanol | 72.95 parts by weight |
| Water | 18.24 parts by weight |

(*1): The reaction product was obtained by the method shown below. Specifically, in methyl ethyl ketone of 40° C. were dissolved 479 g of DESMODUR ® N100, dibutyltin dilaurate as a catalyst and 2,6-di-tert-butyl-4-methylphenol as a stabilizer. The amount of the methyl ethyl ketone was controlled so as to have a final concentration of non-volatiles of about 30% by weight. Then, 174 g of hydroxyethyl acrylate and 447 g of pentaerythritol triacrylate were added thereto so as not to exceed the temperature at 42° C. After stirring for 2 hours, the temperature was raised to 60° C. and maintained at that temperature for 2 hours. The reaction was monitored by infrared spectroscopic analysis and the isocyanate present at the termination of the reaction was quenched with an appropriate amount of methanol. The resulting mixture was gradually added to 30 liters of water with stirring and the component deposited was collected and dried to obtain 1,080 g of the reaction product.

(*2): Infrared absorbing dye (3) was 2-[2-[2-phenylthio-3-[(1,3-dihydro-1,3,3-trimethyl-2H-indol-2-ylidene)ethylidene]-1-cyclohexen-1-yl]ethenyl]-1,3,3-trimethyl-3H-indolium chloride.

(*3): BYK 307 was a modified polysiloxane available from BYK Chemie.

The image-recording layer was over-coated with a solution containing 5.26 parts by weight of polyvinyl alcohol and 0.93 parts by weight of polyvinylimidazole dissolved in 3.94 parts by weight of isopropanol and 89.87 parts by weight of water to form a protective layer having a dry coating amount of 2 g/m$^2$, thereby preparing Lithographic printing plate precursors (25) to (28), respectively.

The lithographic printing plate precursor thus-obtained was subjected to the image exposure and printing in the same manner as in Example 1 and evaluated in the same manner as in Example 1. The results obtained are shown in Table 6.

TABLE 6

| | Lithographic Printing Plate Precursor | Binder Polymer | Evaluation Result of Printing | | | |
|---|---|---|---|---|---|---|
| | | | Printing Durability ($\times 10^4$ sheets) | On-press Development Property (sheets) | Printing Stain | On-press Development Scum |
| Example 17 | 25 | 1 | 5.5 | 10 | 5 | 5 |
| Example 18 | 26 | 7 | 6.8 | 7 | 5 | 5 |
| Comparative Example 9 | 27 | (B-7) shown above | 3.2 | 34 | 3 | 2 |
| Comparative Example 10 | 28 | B-1 (shown in Table 3) | 2.2 | 43 | 3 | 3 |

From the results shown in Table 6, it can be seen that the on-press development property is remarkably improved by using the urethane resin binder having an ethylene oxide chain in its side chain according to the invention. It is also found that the unexpected result in that the on-press development scum is considerably reduced and the printing durability is improved is obtained in addition to the advantage in the on-press development property in comparison with the case where the urethane resin binder having an ethylene oxide chain in its main chain is used.

What is claimed is:

1. A lithographic printing plate precursor comprising:

a support; and an image-recording layer which comprises a urethane resin synthesized with at least one compound represented by the following formulae (2) and (3), an infrared absorbing agent, a radical polymerizable compound and a radical polymerization initiator and an unexposed area of which is capable of being removed with at least one of dampening water and ink on a printing machine when the lithographic printing plate precursor is exposed:

(2)

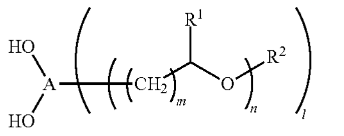

(3)

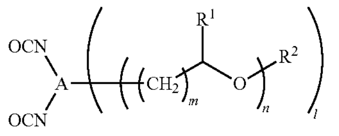

wherein, in the formula (2), m represents from 1 to 3, n represents from 2 to 60, 1 represents 1 to 6, $R_1$ each independently represents a hydrogen atom or a methyl group, $R_2$ each independently represents an alkyl group having 12 or less carbon atoms, and A represents a 3-valent to 8-valent organic residue which is made from at least one non-metallic atom and is made by a combination of at least one of the following four groups represented by (4):

(4)

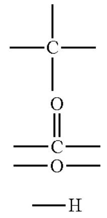

and, in the formula (3), y represents from 1 to 3, z represents from 2 to 60, x represents 1 to 6, $R_3$ each independently represents a hydrogen atom or a methyl group, $R_4$ each independently represents an alkyl group having 12 or less carbon atoms, and B represents a 3-valent to 8-valent organic residue which is made from at least one non-metallic atom and is made by a combination of at least one of the following five groups represented by (5):

(5)

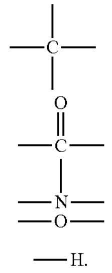

2. The lithographic printing plate precursor as claimed in claim 1, wherein a content of a repeating unit derived from the compound represented by the formula (2) or (3) is from 10 to 90% by mole based on a total mole number of a diol and a diisocyanate used in synthesis of the urethane resin.

3. The lithographic printing plate precursor as claimed in claim 1, wherein the urethane resin further has one or more ethylenically unsaturated groups.

4. The lithographic printing plate precursor as claimed in claim 1, wherein the radical polymerizable compound has at least one of a urethane bond and an isocyanuric ring.

5. The lithographic printing plate precursor as claimed in claim 1, wherein the urethane resin has a weight average molecular weight of from 10,000 to 300,000.

6. The lithographic printing plate precursor as claimed in claim 1, wherein the image-recording layer comprises a polymer particle.

7. The lithographic printing plate precursor as claimed in claim 6, wherein the polymer particle is a microcapsule containing a compound having one or more ethylenically unsaturated groups.

8. The lithographic printing plate precursor as claimed in claim 6, wherein the polymer particle is an organic resin particle comprising at least acrylonitrile as a constituting component.

9. The lithographic printing plate precursor as claimed in claim 1, which further comprises a protective layer so that the support, the image-recording layer and the protective layer are provided in this order.

10. The lithographic printing plate precursor as claimed in claim 9, wherein the protective layer comprises a hydrophilic resin.

11. The lithographic printing plate precursor as claimed in claim 9, wherein the protective layer comprises an inorganic stratiform compound.

12. A plate making method of a lithographic printing plate precursor comprising:

imagewise exposing the lithographic printing plate precursor as claimed in claim 1; and removing an unexposed area of the image-recording layer by supplying at least one of printing ink and dampening water to the exposed lithographic printing plate precursor on a printing machine to prepare a lithographic printing plate, wherein a development processing step is not conducted between the imagewise exposing and the removing.

13. The lithographic printing plate precursor as claimed in claim 1, wherein, in formula (2), m represents 1, 1 represents 1 to 2 and A represents a 3-valent to 4-valent organic residue, and in formula (3), y represents 1, x represents 1 to 2 and B represents a 3-valent to 4-valent organic residue.

14. The lithographic printing plate precursor as claimed in claim 1, wherein, in the formula (2), m represents 1, 1 represents 1, $R_2$ represents a methyl group and A represents a 3-valent to 4-valent organic residue, and in the formula (3), y represents 1, x represents 1, $R_4$ represents a methyl group and B represents a 3-valent organic residue.

* * * * *